(12) United States Patent
Pi et al.

(10) Patent No.: US 9,444,591 B2
(45) Date of Patent: Sep. 13, 2016

(54) METHODS AND APPARATUS FOR CHANNEL INTERLEAVING IN OFDM SYSTEMS

(71) Applicant: Samsung Electronics Co., Ltd., Suwon-si, Gyeonggi-do (KR)

(72) Inventors: Zhouyue Pi, Allen, TX (US); Jiannan Tsai, Plano, TX (US); Farooq Khan, Allen, TX (US)

(73) Assignee: Samsung Electronics, Co., Ltd., Suwon-si (KR)

( * ) Notice: Subject to any disclaimer, the term of this patent is extended or adjusted under 35 U.S.C. 154(b) by 0 days.

(21) Appl. No.: 14/600,918

(22) Filed: Jan. 20, 2015

(65) Prior Publication Data

US 2015/0131611 A1    May 14, 2015

Related U.S. Application Data

(63) Continuation of application No. 13/725,195, filed on Dec. 21, 2012, now Pat. No. 8,937,919, which is a continuation of application No. 12/155,096, filed on May 29, 2008, now Pat. No. 8,908,632.

(60) Provisional application No. 60/929,026, filed on Jun. 8, 2007.

(51) Int. Cl.
*H04W 72/00* (2009.01)
*H04L 5/00* (2006.01)
(Continued)

(52) U.S. Cl.
CPC .............. *H04L 5/0016* (2013.01); *H03M 7/24* (2013.01); *H03M 13/27* (2013.01);
(Continued)

(58) Field of Classification Search
CPC ........... H03M 13/27; H03M 13/2957; H03M 13/6306; H03M 13/6225; H03M 7/24; H04J 13/18; H04L 1/1819; H04L 5/0016; H04L 5/0023; H04L 5/0028; H04L 5/0041; H04L 5/0046; H04L 5/0064; H04W 72/044
USPC ................ 370/329–330, 341, 431, 335, 537, 370/465–467, 469; 375/260–261, 295
See application file for complete search history.

(56) References Cited

U.S. PATENT DOCUMENTS

| | | | |
|---|---|---|---|
| 5,136,578 | A | 8/1992 | Beshai et al. |
| 6,473,467 | B1 | 10/2002 | Wallace et al. |

(Continued)

FOREIGN PATENT DOCUMENTS

| | | | |
|---|---|---|---|
| CN | 1728695 A | * | 2/2006 |
| EP | 1780925 A2 | | 5/2007 |

(Continued)

OTHER PUBLICATIONS

Japanese Rejection dated Sep. 24, 2014 in connection with Japanese Patent Application No. 2013-187078; 5 pgs.

(Continued)

*Primary Examiner* — Mohamed Kamara

(57) ABSTRACT

A method and apparatus for channel interleaving in a wireless communication system. In one aspect of the present invention, the data resource elements are assigned to multiple code blocks, and the numbers of data resource elements assigned to each code block are substantially equal. In another aspect of the present invention, a time-domain-multiplexing-first (TDM-first) approach and a frequency-domain-multiplexing-first (FDM-first) approach are proposed. In the TDM-first approach, at least one of a plurality of code blocks are assigned with a number of consecutive data carrying OFDM symbols. In the FDM-first approach, at least one of the plurality of code blocks are assigned with all of the data carrying OFDM symbols. Either one of the TDM first approach and the FDM-first approach may be selected in dependence upon the number of the code blocks, or the transport block size, or the data rate.

8 Claims, 16 Drawing Sheets

(51) Int. Cl.
*H03M 13/27* (2006.01)
*H03M 13/00* (2006.01)
*H04W 72/04* (2009.01)
*H03M 7/24* (2006.01)
*H03M 13/29* (2006.01)
*H04J 13/18* (2011.01)
*H04L 1/18* (2006.01)

(52) U.S. Cl.
CPC ... *H03M 13/6306* (2013.01); *H03M 13/6525* (2013.01); *H04L 5/0028* (2013.01); *H04L 5/0041* (2013.01); *H04L 5/0046* (2013.01); *H04L 5/0064* (2013.01); *H04W 72/044* (2013.01); *H03M 13/2957* (2013.01); *H04J 13/18* (2013.01); *H04L 1/1819* (2013.01); *H04L 5/0023* (2013.01)

(56) References Cited

U.S. PATENT DOCUMENTS

| | | | |
|---|---|---|---|
| 6,870,808 | B1 | 3/2005 | Liu et al. |
| 8,185,160 | B1 | 5/2012 | Hou et al. |
| 2003/0035491 | A1 | 2/2003 | Walton et al. |
| 2003/0123409 | A1* | 7/2003 | Kwak ............... H04L 1/0061 370/335 |
| 2005/0058089 | A1 | 3/2005 | Vijayan et al. |
| 2006/0153315 | A1* | 7/2006 | Chen ............... H04B 7/18515 375/295 |
| 2007/0098098 | A1* | 5/2007 | Xiao ............... H04L 1/0026 375/260 |
| 2007/0183515 | A1 | 8/2007 | Lim et al. |
| 2007/0195899 | A1 | 8/2007 | Bhushan et al. |
| 2007/0259672 | A1* | 11/2007 | Heo ............... H04W 72/042 455/452.2 |
| 2007/0291871 | A1* | 12/2007 | Khan ............... H04L 1/0056 375/296 |
| 2008/0098273 | A1* | 4/2008 | Blankenship ......... H03M 13/05 714/746 |
| 2008/0130559 | A1 | 6/2008 | Pi |
| 2008/0285488 | A1 | 11/2008 | Walton et al. |
| 2009/0149187 | A1 | 6/2009 | Miki et al. |

FOREIGN PATENT DOCUMENTS

| | | |
|---|---|---|
| EP | 1835777 | 9/2007 |
| EP | 1865733 A1 | 12/2007 |
| JP | 2010-087727 A | 4/2010 |
| JP | 2010-529773 | 8/2010 |
| RU | 2321951 C2 | 10/2005 |
| RU | 2292116 C2 | 1/2007 |
| WO | WO 2005-050873 A1 | 6/2005 |
| WO | WO 2006-109439 A1 | 10/2006 |
| WO | WO 2007-029965 A1 | 3/2007 |
| WO | WO 2007-052651 A1 | 5/2007 |

OTHER PUBLICATIONS

European Search Report dated Mar. 18, 2014 in connection with European Patent Application No. 13194448.0; 10 pgs.
European office Action dated Apr. 30, 2014 in connection wiht European patent Application No. 08766168.2; 12 pgs.
3GPP TSG RAN WG1 #44-bis; "Downlink OFDMA Resource Allowcation and Mapping Rules for Distributed Mode Users in E-UTRA"; R1-060873; Athens, Greece; Mar. 27-31, 2006; 5 pgs.
3GP TSG RAN1#44; Resource Allocation Mapping Rules and TP; R1-060400; Denver USA; Feb. 13-17, 2006; 4 pgs.
Translation of Examination Report dated Nov. 5, 2013 in Japanese Patent Application No. 2012-128893; 7 pgs.
R1-062577, "L1 Multiplexing aspects of broadcast/unicast superposition"; 3GP TSG RAN WG1 Meeting #46bis; Seoul, South Korea, Oct. 9-13, 2006, 3 pages.
R1-070873, "Signaling Resource Allocations in DL Control Channel"; 3GPP TSG-RAN WG1 Meeting #48; St Louis, MO, USA; Feb. 12-16, 2007, 10 pages.
3GPP TSG RAN1 #49 "On Enabling Pipelining of Channel Coding Operations in LTE"; Kobe, Japan; May 7-11, 2007; 3 pages.
European Search Report dated Oct. 19, 2011 in connection with European Patent Application No. Ep 11 17 8064.
Adve Raviraj, "MIMO Systems and Transmit Diversity", May 1, 2007, 37 pages.
Ibrahim S. Raad, et al., "Exploiting Time Diversity to Improve Block Spread OFDM in a Multipath Environment", 2006 IEEE, pp. 2444-2449.
Decision on Grant dated Dec. 20, 2010 in connection with Russian Patent Application No. 2009145278.
European Search Report in connection with European Application No. 08766168.2 dated Oct. 22, 2010.
Samsung: "Channel Coding and Interleaving to Enable Pipelining in LTE", May 7, 2007, pp. 1-4, XP-002604287.
Samsung: "LTE Channel Interleaver Design for Multiple Code blocks", Mar. 26, 2007, 3GPP Written Contributions at Meeting Database, pp. 1-3, XP-002604286.
Motorola: "EUTRA SC-FDMA Uplink Resource Block, Resource Allocation and Pilot/Reference Signal Design & TP"; R1-060246; Finland; Jan. 23, 2006, pp. 1-18, XP-050417574.
3GPP TSG RAN; Motorola: "Code Block Segmentation for LTE Channel Coding"; Working Group I (WG1), Feb. 12, 2007, pp. 1-5, XP-002434167.
3GPP TSG RAN; "Physical Channels and Modulation (Release 8)"; 3GPP TS 36.211 V1.0.0 (Mar. 2007); RP-070169, vol. 36.211, No. V1.0.0, Mar. 1, 2007, pp. 1-30, XP-002552926.
International Search Report and the Written Opinion of the International Searching Authority dated Dec. 23, 2008 in connection with PCT Application No. PCT/KR2008/003206.

* cited by examiner

METHODS AND APPARATUS FOR CHANNEL INTERLEAVING IN OFDM SYSTEMS

CLAIM OF PRIORITY

This application is a continuation of U.S. patent application Ser. No. 13/725,195 filed Dec. 21, 2012 and entitled "METHODS AND APPARATUS FOR CHANNEL INTERLEAVING IN OFDM SYSTEMS," which is a continuation of U.S. patent application Ser. No. 12/155,096 filed May 29, 2008 and entitled "METHODS AND APPARATUS FOR CHANNEL INTERLEAVING IN OFDM SYSTEMS," and claims priority to U.S. Provisional Patent Application Ser. No. 60/929,026 filed Jun. 8, 2007.

BACKGROUND OF THE INVENTION

1. Field of the Invention

The present invention related to methods and apparatus for channel interleaving in OFDM systems.

2. Description of the Related Art

Telecommunication enables transmission of data over a distance for the purpose of communication between a transmitter and a receiver. The data is usually carried by radio waves and is transmitted using a limited transmission resource. That is, radio waves are transmitted over a period of time using a limited frequency range.

In a contemporary communication system, the information to be transmitted are first encoded and then modulated to generate multiple modulation symbols. The symbols are subsequently mapped into a time and frequency resource block available for data transmission. Usually, the time and frequency resource block is segmented into a plurality of equal duration resource elements.

In Third ($3^{rd}$) Generation Partnership Project Long Term Evolution (3GPP LTE) systems, certain resource elements are allocated for control signal transmission. Therefore, the data symbols may be mapped into the resource elements that are not allocated for control signal transmission. Each data transmission carries information bits of one or multiple transport blocks. When a transport block is larger than the largest code block size, the information bits in a transport block may be segmented into multiple code blocks. The process of dividing the information bits in a transport block into multiple code blocks is called code block segmentation. Due to the limited selection of code block sizes and the attempt to maximize packing efficiency during the code block segmentation, the multiple code blocks of a transport block may have different sizes. Each code block will be encoded, interleaved, rate matched, and modulated. Therefore, the data symbols for a transmission may consist of modulation symbols of multiple code blocks.

SUMMARY OF THE INVENTION

It is therefore an object of the present invention to provide a method and apparatus for efficiently transmit data using limited transmission resources.

It is another object of the present invention to provide a method and apparatus to maximize time diversity and frequency diversity.

It is a further object of the present invention to provide a method and apparatus to minimize interference between different code blocks.

According to one aspect of the present invention, a method for resource allocation is provided. According to the method, a time and frequency resource block is divided into a plurality of equal duration resource elements in a time and frequency domain. A subset of the plurality of resource elements are data resource elements that are available for data transmission. A data block to be transmitted is segmented into a plurality of code blocks. Substantially equal number of data resource elements are assigned to the plurality of code blocks.

The number of data resource elements assigned to a code block may be established by:

$$M_j = \left\lceil \frac{N-j}{N_{seg}} \right\rceil,$$

for $j = 0, 1, \ldots, N_{seg} - 1$, where $M_j$ is the number of the data resource elements assigned to a code block having an index of j, N is the number of the data resource elements in the time and frequency resource block, and $N_{seg}$ is the number of the code blocks in the time and frequency resource block.

Alternatively, the number of data resource elements assigned to a code block may be established by:

$$M_j = \left\lceil \frac{N/2 - j}{N_{seg}} \right\rceil \times 2,$$

for $j = 0, 1, \ldots, N_{seg} - 1$, where $M_j$ is the number of the data resource elements assigned to a code block having an index of j, N is the number of the data resource elements in the time and frequency resource block, and $N_{seg}$ is the number of the code blocks in the time and frequency resource block.

Still alternatively, the number of data resource elements assigned to a code block may be established by:

$$M_j = \left\lceil \frac{(N-1)/2 - j}{N_{seg}} \right\rceil \times 2,$$

for $j = 0, 1, \ldots, N_{seg} - 1$, where $M_j$ is the number of the data resource elements assigned to a code block having an index of j, N is the number of the data resource elements in the time and frequency resource block, and $N_{seg}$ is the number of the code blocks in the time and frequency resource block.

According to another aspect of the present invention, a method for resource allocation is provided. According to the method, a time and frequency resource block is divided into a plurality of equal duration frequency resource units in a frequency-domain, and into a plurality of equal duration time resource units in a time-domain. One frequency resource unit in one time resource unit is a resource element. A subset of resource elements within the time and frequency resource block are data resource elements that are available for data transmission. A data block to be transmitted is segmented into a plurality of code blocks. The data resource elements are elements assigned to the plurality of code block. At least one data block corresponding to the data resource elements in a continuous set of time resource units.

An index scheme may be provided for the method. First, an index-within-a-time-resource-unit, is assigned to each data resource element within each time resource unit. The index-within-a-time-resource-unit for a data resource element in a time resource unit having an index i is $I_i(x)$, where x is a natural-order-index of the data resource element within the time resource unit i, $x=0, 1, \ldots, N_i-1$, $N_i$ is the number of data resource elements within the time resource unit i, $i=1, 2, \ldots, i_T$, and $i_T$ is the total number of time resource units within the time and frequency resource block. Then, an index-within-an-assignment is assigned to each data resource element within the time and frequency resource block. The index-within-an-assignment of a data resource element having an index-within-a-time-resource-unit of $I_i(x)$ is $I_A(x,i)$, and:

$$I_A(x, i) = I_i(x) + \sum_{k=1}^{i-1} N_k,$$

for $i = 1, 2, \ldots, i_T$, and $x = 0, 1, \ldots, N_i - 1$, where $I_A(x,i)=0, 1, \ldots, N-1$, N is the number of data resource elements in the time and frequency resource block, and $$N = \sum_{i=1}^{i_T} N_i.$$

The index-within-a-time-resource-unit, $I_i(x)$, of a data resource element may be equal to the natural-order-index, x, of the data resource element within a time resource unit having an index of j.

Alternatively, the index-within-a-time-resource-unit, $I_i(x)$, of a data resource element may be related to the natural-order-index, x, of the data resource element within a time resource unit having an index of j, in accordance with an interleaving function.

In accordance with the index scheme, a data resource element having an index-within-an-assignment of $I_A(x,i)$ may be assigned to a code block having an index of j, such that:

$$\sum_{k=0}^{j-1} \left\lceil \frac{N-j}{N_{seg}} \right\rceil \le I_A(x, i) < \sum_{k=0}^{j} \left\lceil \frac{N-j}{N_{seg}} \right\rceil,$$

where $j=0, 1, \ldots, N_{seg}-1$, and $N_{seg}$ is the number of code blocks in the time and frequency resource block.

Alternatively, a data resource element having an index-within-an-assignment of $I_A(x,i)$ may be assigned to a code block having an index of j, such that:

$$j \times \left\lceil \frac{N}{N_{seg}} \right\rceil \le I_A(x, i) < (j+1) \times \left\lceil \frac{N}{N_{seg}} \right\rceil,$$

if $0 \le j < (N \bmod N_{seg})$, and $$N - (N_{seg} - j) \times \left\lfloor \frac{N}{N_{seg}} \right\rfloor \le I_A(x, i) < N - (N_{seg} - j - 1) \times \left\lfloor \frac{N}{N_{seg}} \right\rfloor,$$

if $(N \bmod N_{seg}) \le j < N_{seg}$ where $j=0, 1, \ldots, N_{seg}-1$, and $N_{seg}$ is the number of code blocks in the time and frequency resource block.

Still alternatively, a data resource element having an index-within-an-assignment of $I_A(x,i)$ may be assigned to a code block having an index of j, such that:

$$\sum_{k=0}^{j-1} \left\lceil \frac{N/2-j}{N_{seg}} \right\rceil \times 2 \le I_A(x, i) < \sum_{k=0}^{j} \left\lceil \frac{N/2-j}{N_{seg}} \right\rceil \times 2,$$

where $j=0, 1, \ldots, N_{seg}-1$, and $N_{seg}$ is the number of code blocks in the time and frequency resource block.

Still alternatively, a data resource element having an index-within-an-assignment of $I_A(x,i)$ may be assigned to a code block having an index of j, such that:

$$2 \times j \times \left\lceil \frac{N}{2 \times N_{seg}} \right\rceil \le I_A(x, i) < 2 \times (j+1) \times \left\lceil \frac{N}{2 \times N_{seg}} \right\rceil,$$

if $0 \le j < (N \bmod N_{seg})$, and $$N - 2 \times (N_{seg} - j) \times \left\lfloor \frac{N}{2 \times N_{seg}} \right\rfloor \le$$

$$I_A(x, i) < N - 2 \times (N_{seg} - j - 1) \times \left\lfloor \frac{N}{2 \times N_{seg}} \right\rfloor,$$

if $(N \bmod N_{seg}) \le j < N_{seg}$, where $j=0, 1, \ldots, N_{seg}-1$, and $N_{seg}$ is the number of code blocks in the time and frequency resource block.

According to still another aspect of the present invention, a method for resource allocation is provided. According to the method, at least one time resource unit corresponding to all of the code blocks.

Using the above mentioned index scheme, a data resource element having an index-within-an-assignment of $I_A(x,i)$ may be assigned to a code block having an index of j, such that:

$$I_A(x, i) = m \times N_{seg} + j, \text{ for } m = 0, 1, \ldots, \left\lceil \frac{N-j}{N_{seg}} \right\rceil - 1,$$

where $j=0, 1, \ldots, N_{seg}-1$, and $N_{seg}$ is the number of code blocks in the time and frequency resource block.

Alternatively, a data resource element having an index-within-an-assignment of $I_A(x,i)$ may be assigned to a code block having an index of j, such that:

$$j = I_A(x,i) \bmod N_{seg}, \text{ for } I_A(x,i)=0,1, \ldots, N-1,$$

where $j=0, 1, \ldots, N_{seg}-1$, and $N_{seg}$ is the number of code blocks in the time and frequency resource block.

Still alternatively, a data resource element having an index-within-an-assignment of $I_A(x,i)$ may be assigned to a code block having an index of j, such that:

$$\left\lfloor \frac{I_A(x, i)}{2} \right\rfloor = m \times N_{seg} + j, \text{ for } m = 0, 1, \ldots, \left\lceil \frac{N/2-j}{N_{seg}} \right\rceil - 1,$$

where $j=0, 1, \ldots, N_{seg}-1$, and $N_{seg}$ is the number of code blocks in the time and frequency resource block.

Still alternatively, a data resource element having an index-within-an-assignment of $I_A(x,i)$ may be assigned to a code block having an index of j, such that:

$$j = \left\lfloor \frac{I_A(x, i)}{2} \right\rfloor \mod N_{seg}, \text{ for } I_A(x, i) = 0, 1, \ldots, N-1,$$

where $j=0, 1, \ldots, N_{seg}-1$, and $N_{seg}$ is the number of code blocks in the time and frequency resource block.

According to yet another aspect of the present invention, a method for resource allocation is provided. According to the method, when the number of the code blocks is larger than a certain threshold value, at least one of the plurality of code blocks may be assigned with a subset of continuous time resource units that are available for data transmission. When the number of the code blocks is less than the certain threshold value, at least one of the plurality of code blocks may be assigned with all of the time resource units that are available for data transmission.

The certain threshold value may be different for different unit of user equipment.

Alternatively, the certain threshold value may be constant for different unit of user equipment.

According to still yet another aspect of the present invention, a method for resource allocation is provided. According to the method, when the size of the data block is larger than a certain threshold value, at least one of the plurality of code blocks may be assigned with a subset of continuous time resource units that are available for data transmission. When the size of the data block is less than the certain threshold value, at least one of the plurality of code blocks may be assigned with all of the time resource units that are available for data transmission.

According to a further aspect of the present invention, a method for communication is provided. According to the method, a data block to be transmitted is segmented to generate a plurality of transport blocks. Each of the plurality of transport blocks is segmented into a plurality of code blocks. At least two of the plurality of transport blocks containing same number of code blocks.

The number of the code blocks within the at least two transport blocks may be determined in dependence upon one of the at least two transport blocks having a larger number of information bits.

According to a still further aspect of the present invention, a method for communication is provided. According to the method, the transmission resources assigned to at least a first code block within a first transport block may include the transmission resources assigned to a second code block within a second transport block.

According to still another aspect of the present invention, a method for communication is provided. According to the method, the transmission resources assigned to at least a first code block within a first transport block may be the same as the transmission resources assigned to a second code block within a second transport block.

According to still another aspect of the present invention, a wireless terminal in a communication system is provided. The wireless terminal may be constructed with a memory unit, a code block generation unit, a resource mapping unit, and at least one transmission antenna. The memory unit stores a resource grid structure of a time and frequency resource block divided into a plurality of equal duration resource elements in a time and frequency domain. A subset of the plurality of resource elements are data resource elements that are available for data transmission. The code block generation unit segments a data block to be transmitted into a plurality of code blocks. The resource mapping unit assigns substantially equal number of data resource elements to the plurality of code blocks. The at least one transmission antenna transmits the plurality f code blocks by using the data resource elements.

According to still another aspect of the present invention, a wireless terminal in a communication system is provided. The wireless terminal may be constructed with a memory unit, a code block generation unit, a resource mapping unit, and at least one transmission antenna. The memory unit stores a resource grid structure of a time and frequency resource block including a plurality of equal duration frequency resource units in a frequency-domain, and a plurality of equal duration time resource units in a time-domain. One frequency resource unit in one time resource unit may be a resource element, and a subset of resource elements within the time and frequency resource block may be data resource elements that are available for data transmission. The code block generation unit segments a data block to be transmitted into a plurality of code blocks. The resource mapping unit assigns the data resource elements to the plurality of code blocks, with at least one data block being assigned the data resource elements in a continuous set of time resource units. The at least one transmission antenna transmits the plurality f code blocks by using the data resource elements.

According to still another aspect of the present invention, a wireless terminal in a communication system is provided. The wireless terminal may be constructed with a memory unit, a code block generation unit, a resource mapping unit, and at least one transmission antenna. The resource mapping unit assigns the data resource elements to the plurality of code blocks, with at least one time resource unit corresponding to all of the code blocks;

According to still another aspect of the present invention, a wireless terminal in a communication system is provided. The wireless terminal may be constructed with a memory unit, a code block generation unit, a resource mapping unit, and at least one transmission antenna. The resource mapping unit assigns the data resource elements to the plurality of code blocks, such that when the number of the code blocks is larger than a certain threshold value, at least one of the plurality of code blocks corresponding to a subset of continuous time resource units that are available for data transmission; and when the number of the code blocks is less than the certain threshold value, at least one of the plurality of code blocks corresponding to all of the time resource units that are available for data transmission.

According to still another aspect of the present invention, a wireless terminal in a communication system is provided. The wireless terminal may be constructed with a memory unit, a code block generation unit, a resource mapping unit, and at least one transmission antenna. The resource mapping unit assigns the data resource elements to the plurality of code blocks, such that when the size of the data block is larger than a certain threshold value, at least one of the plurality of code blocks corresponding to a subset of continuous time resource units that are available for data transmission; and when the size of the data block is less than the certain threshold value, at least one of the plurality of code blocks corresponding to all of the time resource units that are available for data transmission.

According to still another aspect of the present invention, a wireless terminal in a communication system is provided. The wireless terminal may be constructed with a transport block generation unit and a code block generation unit. The transport block generation unit segments a data block to be transmitted to generate a plurality of transport blocks. The code block generation unit segments each of the plurality of transport blocks into a plurality of code blocks. At least two of the plurality of transport blocks containing same number of code blocks.

According to still another aspect of the present invention, a wireless terminal in a communication system is provided. The wireless terminal may be constructed with a transport block generation unit, a code block generation unit, and a resource mapping unit that assigns transmission resources to the plurality of code blocks. The transmission resources assigned to at least a first code block within a first transport block may include the transmission resources assigned to a second code block within a second transport block.

According to still another aspect of the present invention, a wireless terminal in a communication system is provided. The wireless terminal may be constructed with a transport block generation unit, a code block generation unit, and a resource mapping unit that assigns transmission resources to the plurality of code blocks. The transmission resources assigned to at least a first code block within a first transport block may be the same as the transmission resources assigned to a second code block within a second transport block.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
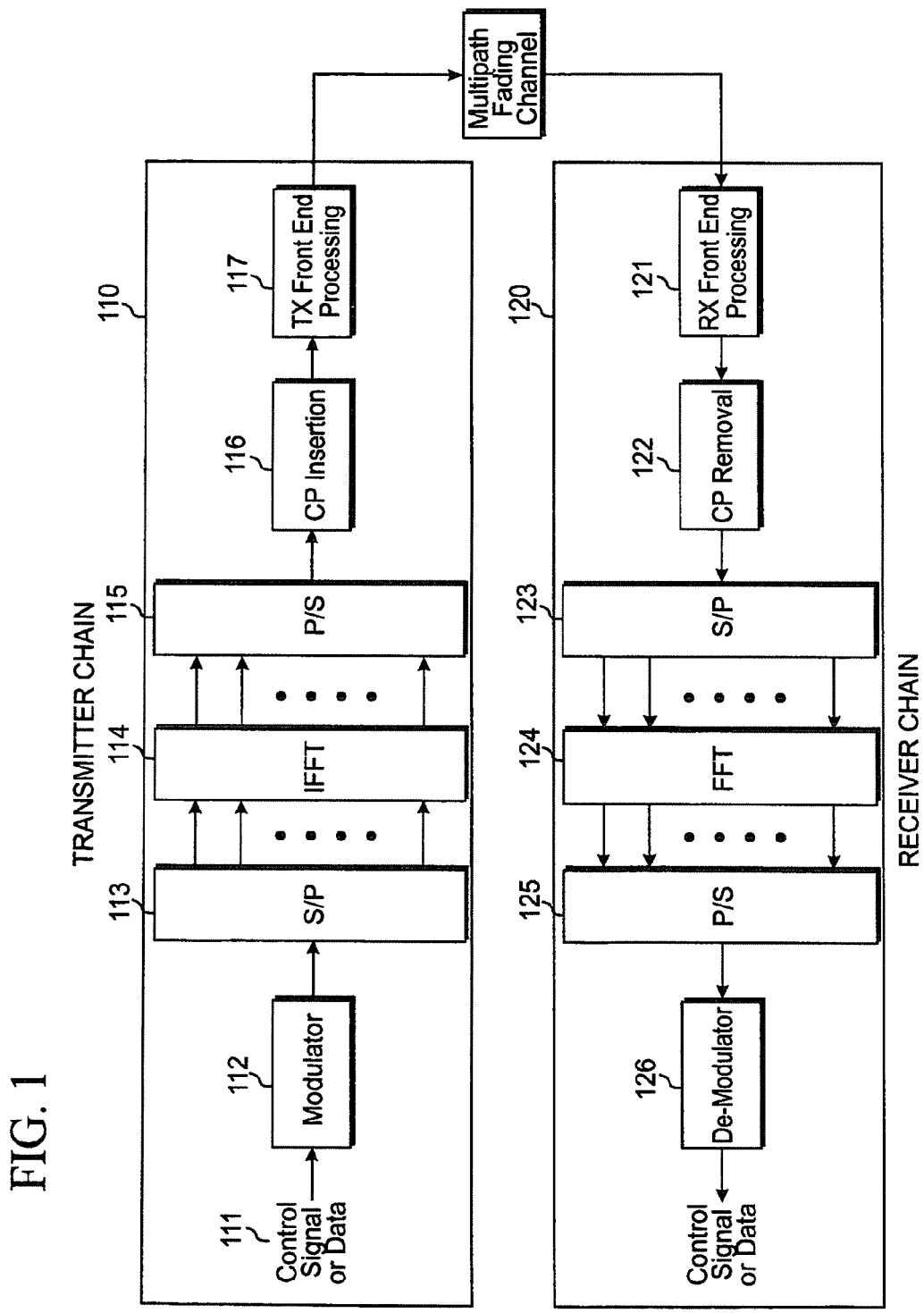
FIG. 1 is schematically illustrates an Orthogonal Frequency Division Multiplexing (OFDM) transceiver chain suitable for the practice of the principles of the present invention.

Orthogonal Frequency Division Multiplexing (OFDM) is a technology to multiplex data in frequency domain. Modulation symbols are carried on frequency sub-carriers. FIG. 1 illustrates an Orthogonal Frequency Division Multiplexing (OFDM) transceiver chain. In a communication system using OFDM technology, at transmitter chain 110, control signals or data 111 is modulated by modulator 112 into a series of modulation symbols, that are subsequently serial-to-parallel converted by Serial/Parallel (S/P) converter 113. Inverse Fast Fourier Transform (IFFT) unit 114 is used to transfer the signals from frequency domain to time domain into a plurality of OFDM symbols. Cyclic prefix (CP) or zero prefix (ZP) is added to each OFDM symbol by CP insertion unit 116 to avoid or mitigate the impact due to multipath fading. Consequently, the signal is transmitted by transmitter (Tx) front end processing unit 117, such as an antenna (not shown), or alternatively, by fixed wire or cable. At receiver chain 120, assuming perfect time and frequency synchronization are achieved, the signal received by receiver (Rx) front end processing unit 121 is processed by CP removal unit 122. Fast Fourier Transform (FFT) unit 124 transfers the received signal from time domain to frequency domain for further processing.

Figure 2:
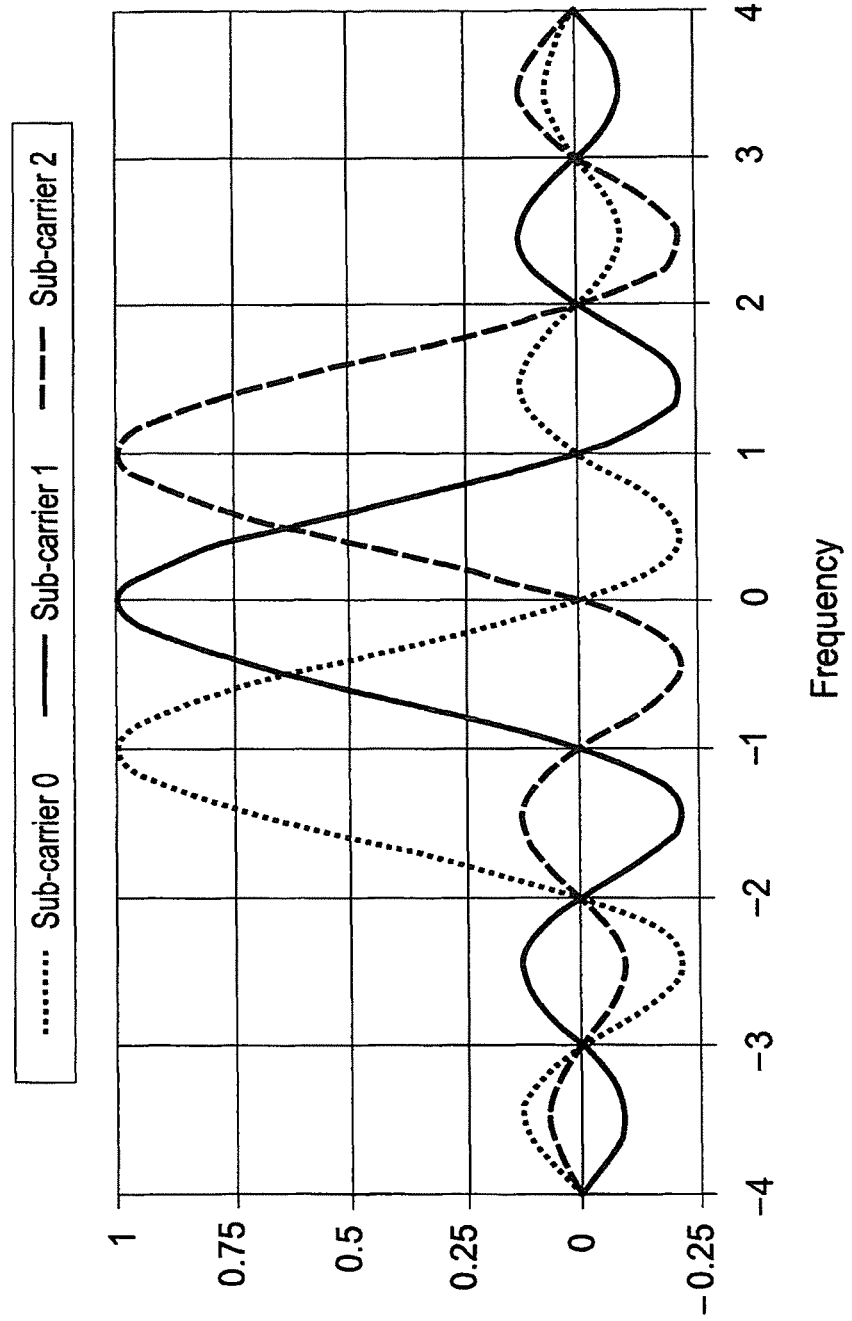
FIG. 2 illustrates two coordinate graphs of OFDM sub-carriers showing amplitude as a function of frequency.

In a OFDM system, each OFDM symbol consists of multiple sub-carriers. Each sub-carrier-within-an-OFDM-symbol carriers a modulation symbol. FIG. 2 illustrates the OFDM transmission scheme using sub-carrier 1, sub-carrier 2, and sub-carrier 3. Because each OFDM symbol has finite duration in time domain, the sub-carriers overlap with each other in frequency domain. The orthogonality is, however, maintained at the sampling frequency assuming the transmitter and the receiver has perfect frequency synchronization, as shown in FIG. 2. In the case of frequency offset due to imperfect frequency synchronization or high mobility, the orthogonality of the sub-carriers at sampling frequencies is destroyed, resulting in inter-carrier-interference (ICI).

Figure 3:
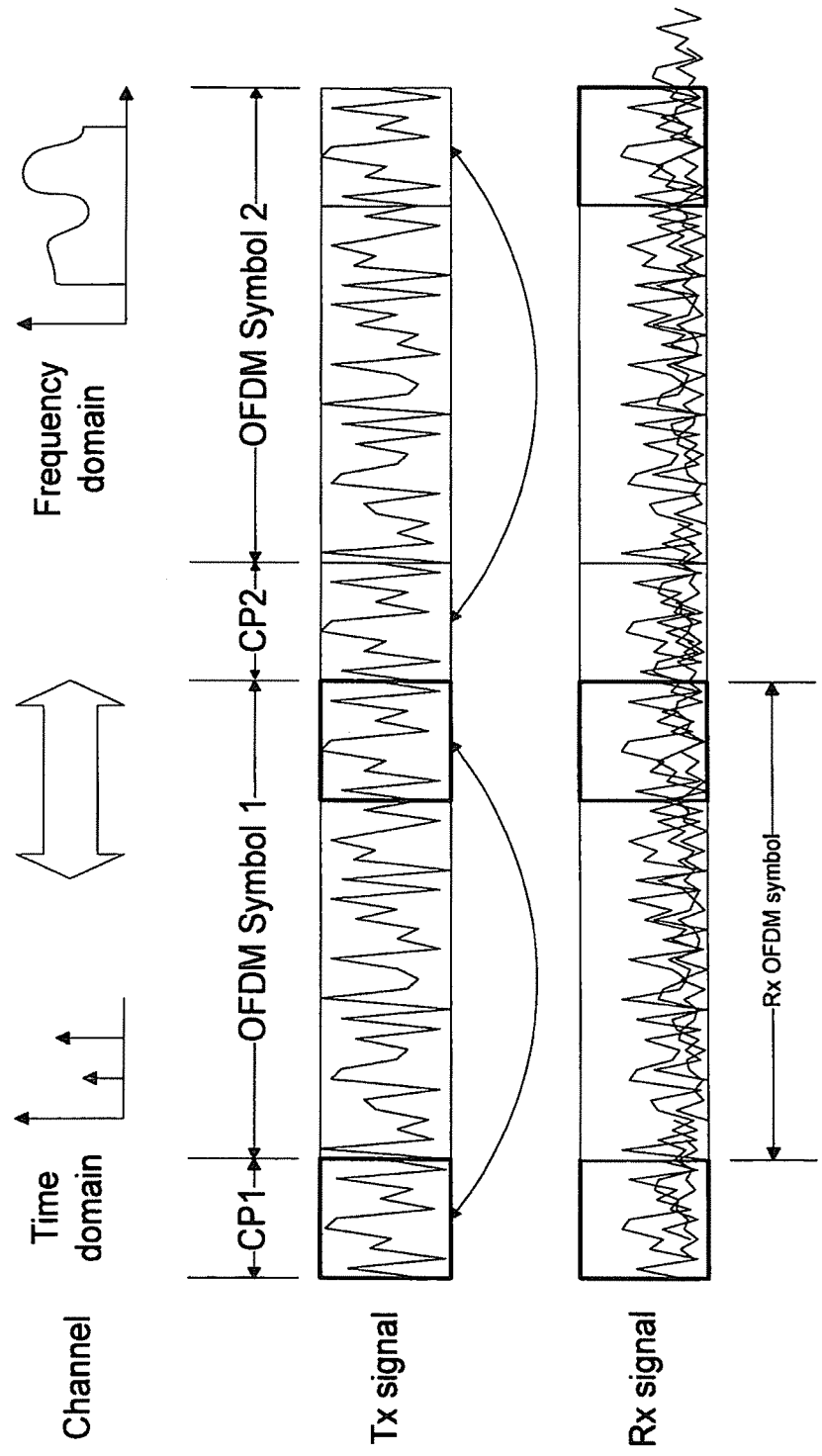
FIG. 3 is an illustration of the transmitted and received waveforms for OFDM symbols in a time domain.

A time domain illustration of the transmitted and received OFDM symbols is shown in FIG. 3. Due to multipath fading, the CP portion of the received signal is often corrupted by the previous OFDM symbol. As long as the CP is sufficiently long, the received OFDM symbol without CP should, however, only contain its own signal convoluted by the multipath fading channel. In general, a Fast Fourier Transform (FFT) is taken at the receiver side to allow further processing frequency domain. The advantage of OFDM over other transmission schemes is its robustness to multipath fading. The multipath fading in time domain translates into frequency selective fading in frequency domain. With the cyclic prefix or zero prefix added, the inter-symbol-interference between adjacent OFDM symbols are avoided or largely alleviated. Moreover, because each modulation symbol is carried over a narrow bandwith, it experiences a single path fading. Simple equalization scheme can be used to combat frequency selection fading.

Figure 4:
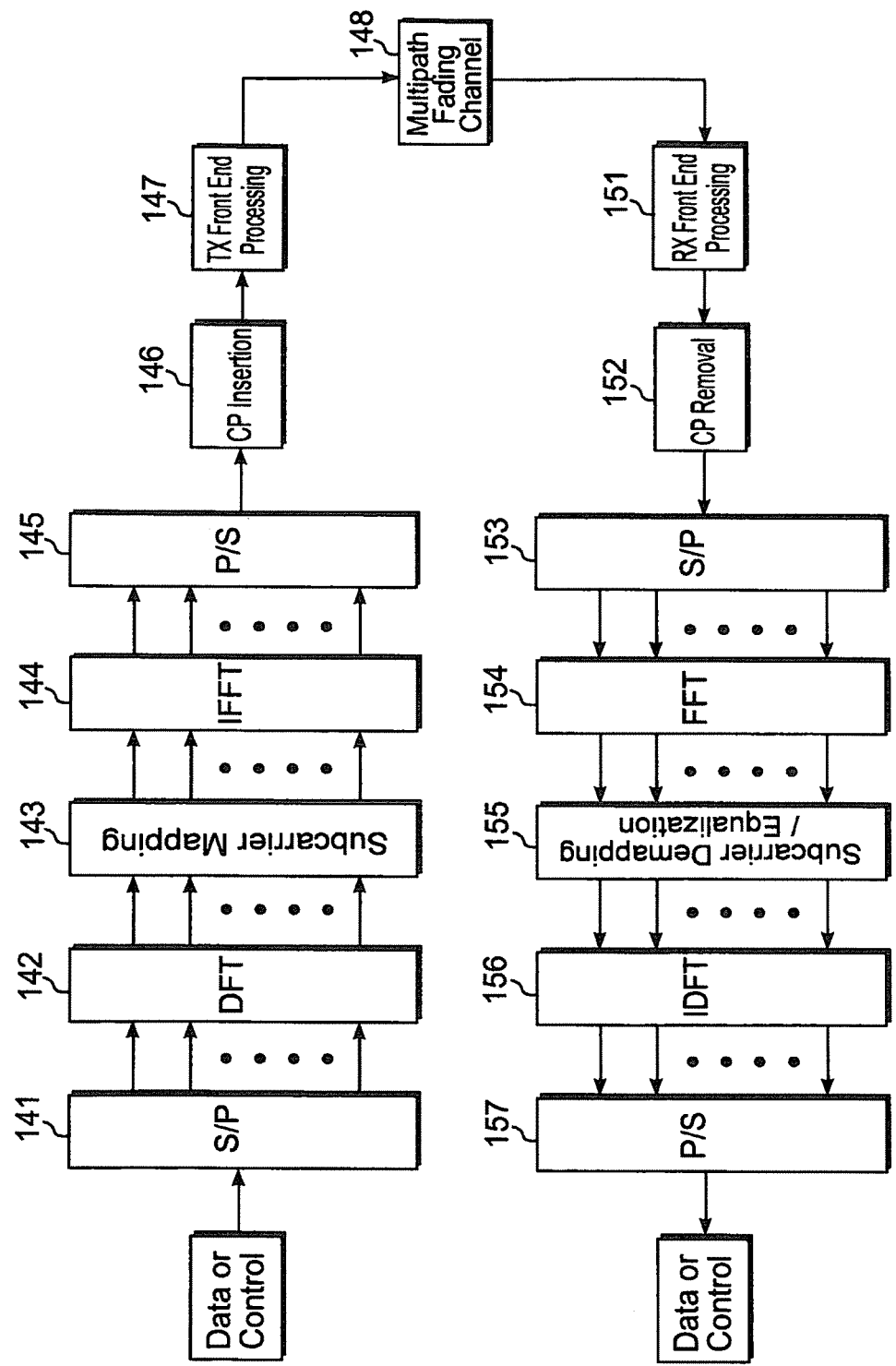
FIG. 4 is an illustration of single carrier frequency division multiple access transceiver chain.
Figure 5:
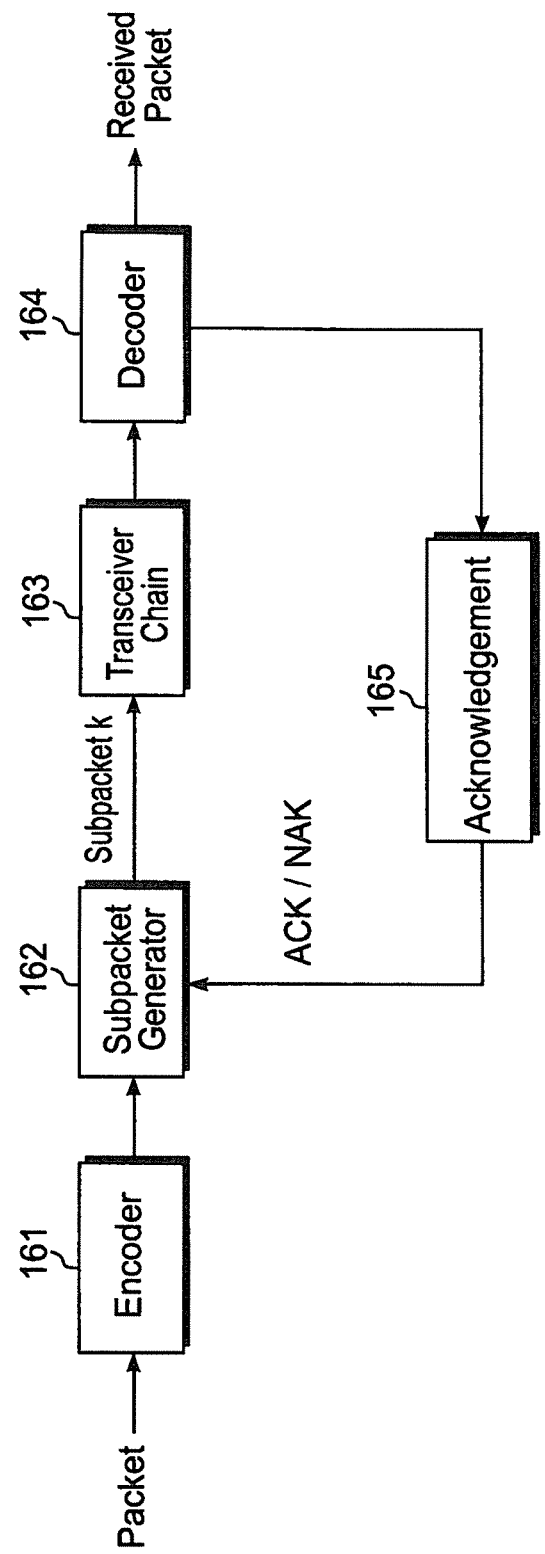
FIG. 5 schematically illustrates a Hybrid Automatic Repeat request (HARQ) transceiver chain.

Single carrier frequency division multiple access (SC-FDMA), which utilizes single carrier modulation and frequency domain equalization is a technique that has similar performance and complexity as those of an OFDMA system. One advantage of SC-FDMA is that the SC-FDMA signal has lower peak-to-average power ratio (PAPR) because of its inherent single carrier structure. Low PAPR normally results in high efficiency of power amplifier, which is particularly important for mobile stations in uplink transmission. SC-FDMA is selected as the uplink multiple acess scheme in 3GPP long term evolution (LTE). An example of the transceiver chain for SC-FDMA is shown in FIG. 4. At the transmitter side, the data or control signal is serial to parallel (S/P) converted by a S/P convertor 181. Discrete Fourier transform (DFT) will be applied to time-domain data or control signal by a DFT transformer 182 before the time-domain data is mapped to a set of sub-carriers by a sub-carrier mapping unit 183. To ensure low PAPR, normally the DFT output in the frequency domain will be mapped to a set of contiguous sub-carriers. Then IFFT, normally with larger size than the DFT, will be applied by an IFFT transformer 184 to transform the signal back to time domain. After parallel to serial (P/S) convertion by a P/S/ converter 185, cyclic prefix (CP) will be added by a CP insertion unit 186 to the data or the control signal before the data or the control signal is transmitted to a transmission front end processing unit 187. The processed signal with a cyclic prefix added is often referred to as a SC-FDMA block. After the signal passes through a communication channel 188, e.g., a multipath fading channel in a wireless communication system, the receiver will perform receiver front end processing by a receiver front end processing unit 191, remove the CP by a CP removal unit 192, apply FFT by a FFT transformer 194 and frequency domain equalization. Inverse Discrete Fourier transform (IDFT) 196 will be applied after the equalized signal is demapped 195 in frequency domain. The output of IDFT will be passed for further time-domain processing such as demodulation and decoding.

In packet-based wireless data communication systems, control signals transmitted through control channels, i.e., control channel transmission, generally accompany data signals transmitted through data channels, i.e., data transmission. Control channel information, including control channel format indicator (CCFI), acknowledgement signal (ACK), packet data control channel (PDCCH) signal, carries transmission format information for the data signal, such as user ID, resource assignment information, Payload size, modulation, Hybrid Automatic Repeat-reQuest (HARQ) information, MIMO related information.

Hybrid Automatic Repeat reQuestion (HARQ) is widely used in communication systems to combat decoding failure and improve reliability. Each data packet is coded using certain forward error correction (FEC) scheme. Each subpacket may only contains a portion of the coded bits. If the transmission for subpacket k fails, as indicated by a NAK in a feedback acknowledgement channel, a retransmission subpacket, subpacket k+1, is transmitted to help the receiver decode the packet. The retransmission subpackets may contain different coded bits than the previous subpackets. The receiver may softly combine or jointly decode all the received subpackets to improve the chance of decoding. Normally, a maximum number of transmissions is configured in consideration of both reliability, packet delay, and implementation complexity.

Figure 6:
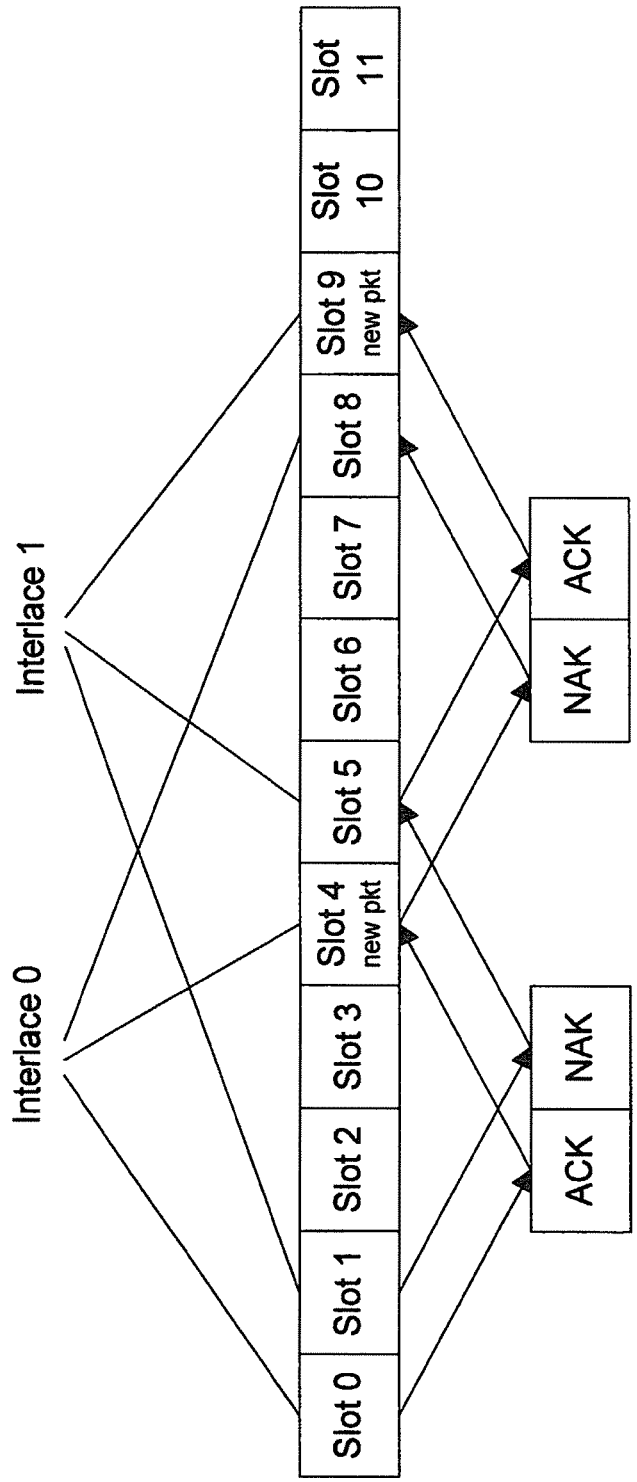
FIG. 6 schematically illustrates a four-channel synchronous HARQ transmission scheme.

Multiple antenna communication systems, which is often referred to as multiple input multiple output (MIMO), are widely used in wireless communication to improve system performance. In a MIMO system shown in FIG. 6, the transmitter has multiple antennas capable of transmitting independent signals and the receiver is equipped with multiple receive antennas. MIMO systems degenerates to single input multiple output (SIMO) if there is only one transmission antenna or if there is only one stream of data transmitted. MIMO systems degenerates to multiple input single output (MISO) if there is only one receive antenna. MIMO systems degenerates to single input single output (SISO) if there is only one transmission antenna and one receive antenna. MIMO technology can significant increase throughput and range of the system without any increase in bandwidth or overall transmit power. In general, MIMO technology increases the spectral efficiency of a wireless communication system by exploiting the additional dimension of freedom in the space domain due to multiple antennas. There are many categories of MIMO technologies. For example, spatial multiplexing schemes increase the transmission rate by allowing multiple data streaming transmitted over multiple antennas. Transmit diversity methods such as space-time coding take advantage of spatial diversity due to multiple transmit antennas. Receiver diversity methods utilizes the spatial diversity due to multiple receive antennas. Beamforming technologies improve received signal gain and reducing interference to other users. Spatial division multiple access (SDMA) allows signal streams from or to multiple users to be transmitted over the same time-frequency resources. The receivers can separate the multiple data streams by the spatial signature of these data streams. Note these MIMO transmission techniques are not mutually exclusive. In fact, many MIMO schemes are often used in an advanced wireless systems.

Figure 7:
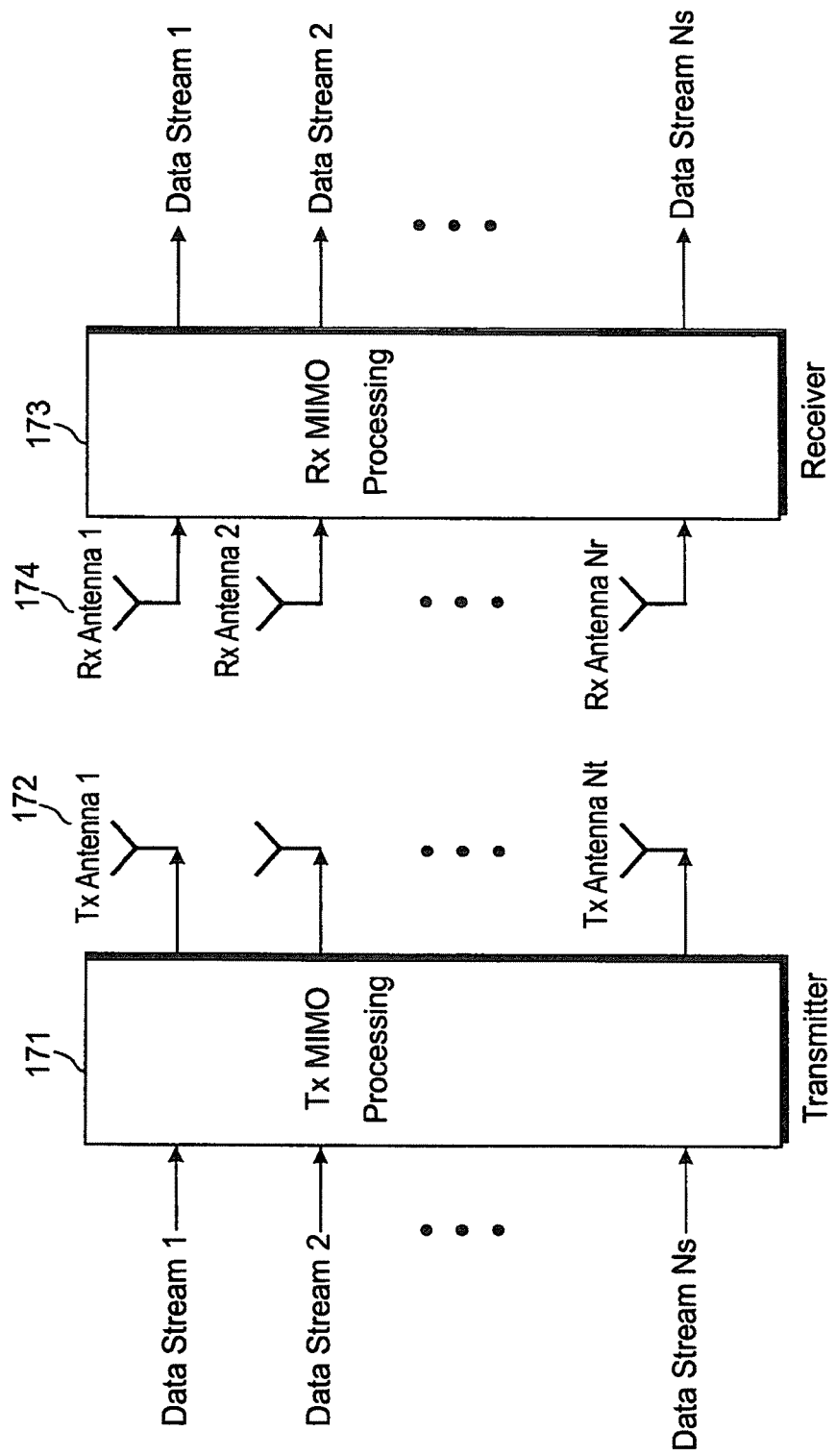
FIG. 7 schematically illustrates a Multiple Input Multiple Output (MIMO) system.
Figure 8:
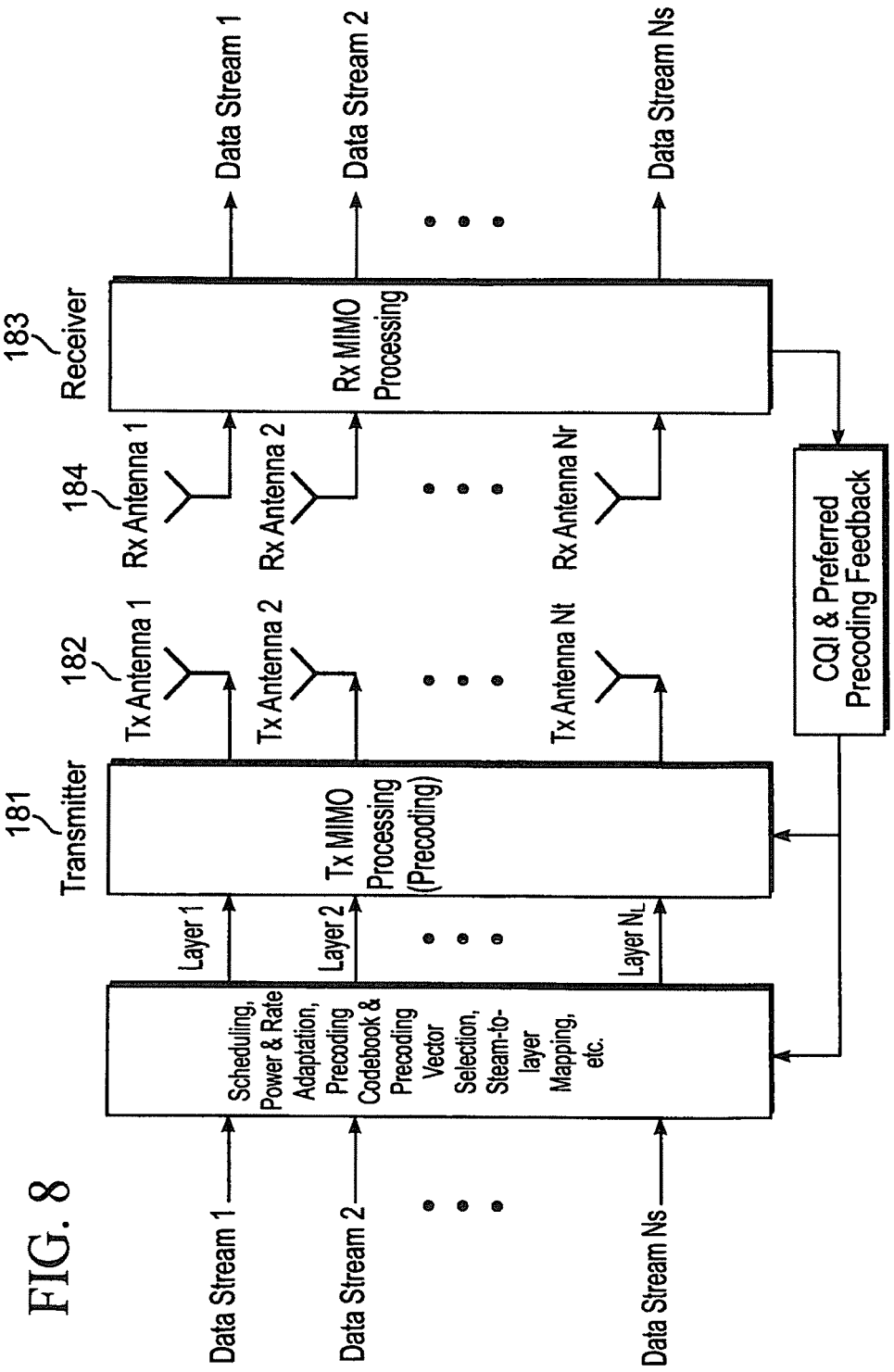
FIG. 8 schematically illustrates a precoded MIMO system.

When the channel is favorable, e.g., the mobile speed is low, it is possible to use closed-loop MIMO scheme to improve system performance. In a closed-loop MIMO systems, the receivers feedback the channel condition and/or preferred Tx MIMO processing schemes. The transmitter utilizes this feedback information, together with other considerations such as scheduling priority, data and resource availability, to jointly optimize the transmission scheme. A popular closed loop MIMO scheme is called MIMO precoding. With precoding, the transmit data streams are premultiplied by a matrix before being passed on to the multiple transmit antennas. As shown in FIG. 7, assume there are Nt transmit antennas and Nr receive antennas. Denote the channel between the Nt transmit antennas and the Nr receive antennas as H. Therefore H is an Nt×Nr matrix. If the transmitter has knowledge about H, the transmitter can choose the most advantageous transmission scheme according to H. For example, if maximizing throughout is the goal, the precoding matrix can be chosen to be the right singular matrix of H, if the knowledge of H is available at the transmitter. By doing so, the effective channel for the multiple data streams at the receiver side can be diagonalized, eliminating the interference between the multiple data streams. The overhead required to feedback the exact value of H, however, is often prohibitive. In order to reduce feedback overhead, a set of precoding matrices are defined to quantize the space of the possible values that H could substantiate. With the quantization, a receiver feeds back the preferred precoding scheme, normally in the form of the index of the preferred precoding matrix, the rank, and the indices of the preferred precoding vectors. The receiver may also feed back the associated CQI values for the preferred precoding scheme.

Another perspective of a MIMO system is whether the multiple data streams for transmission are encoded separately or encoded together. If all the layers for transmission are encoded together, we call it a single codeword (SCW) MIMO system. And we call it a multiple codeword (MCW)

MIMO system otherwise. In the LTE downlink system, when single user MIMO (SU-MIMO) is used, up to two codewords can be transmitted to a single UE. In the case that two codewords are transmitted to a UE, the UE needs to acknowledge the two codewords separately. Another MIMO technique is called spatial division multiple access (SDMA), which is also referred to as multi-user MIMO (MU-MIMO) sometimes. In SDMA, multiple data streams are encoded separately and transmitted to different intended receivers on the same time-frequency resources. By using different spatial signature, e.g., antennas, virtual antennas, or precoding vectors, the receivers will be able to distinguish the multiple data streams. Moreover, by scheduling a proper group of receivers and choosing the proper spatial signature for each data stream based on channel state information, the signal of interest can be enhanced while the other signals can be enhanced for multiple receivers at the same time. Therefore the system capacity can be improved. Both single user MIMO (SU-MIMO) and multi-user MIMO (MU-MIMO) are adopted in the downlink of LTE. MU-MIMO is also adopted in the uplink of LTE while SU-MIMO for LTE uplink is still under discussion.

Figure 9:
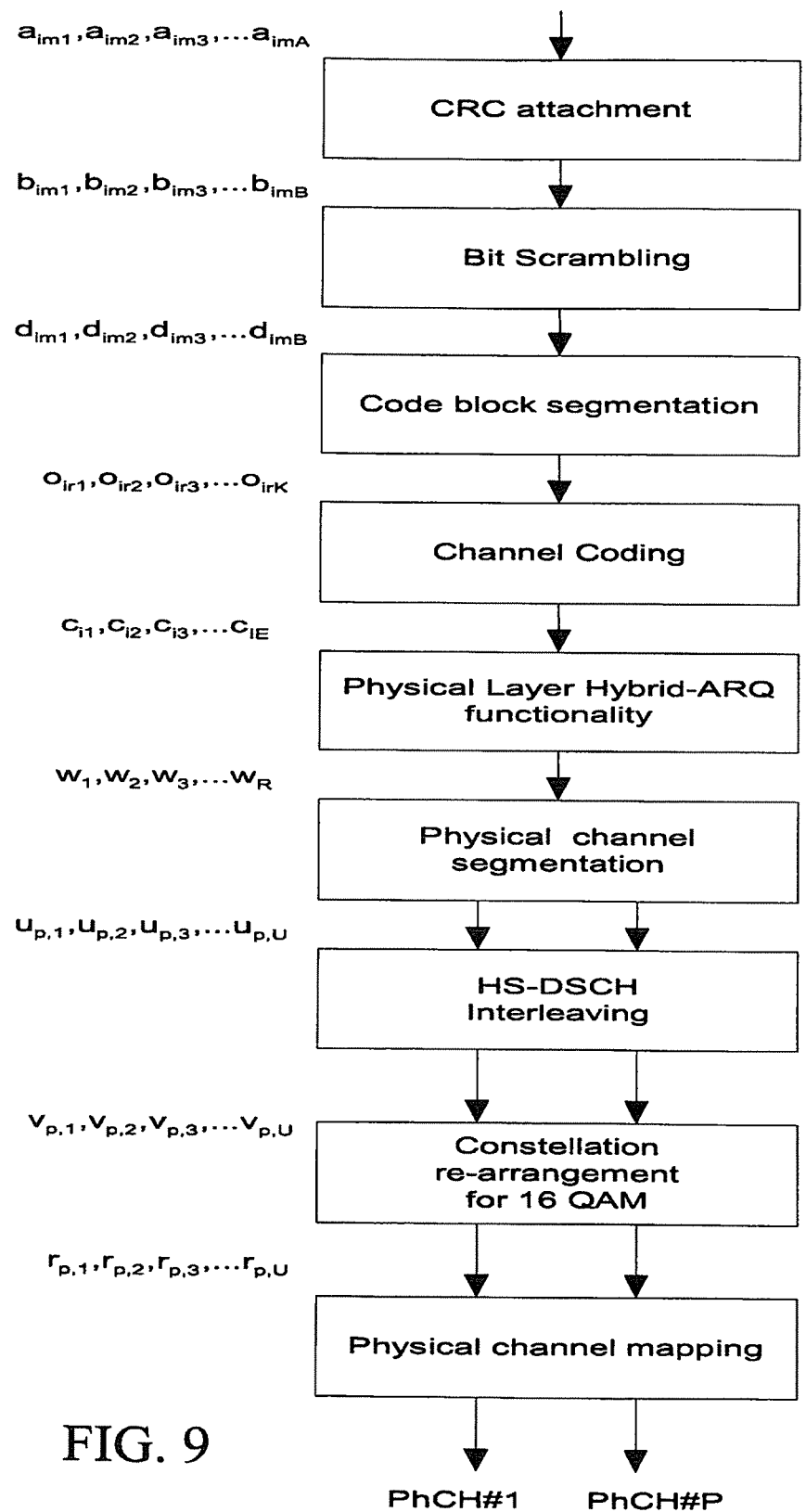
FIG. 9 schematically illustrates a coding chain for High Speed Data Shared Channel (HS-DSCH) in a High Speed Downlink Packet Access (HSDPA) system.

In a LTE system, when a transport block is large (e.g., more than 6144 bits), the transport block is segmented into multiple code blocks so that multiple coded packets can be generated, which is advantageous because of benefits such as enabling parallel processing or pipelining implementation and flexible trade off between power consumption and hardware complexity. Each code block will be encoded by using turbo codes to generate a plurality of coded bits. Coded bits are selected by the rate matching algorithm for each transmission. One transport block, including all the selected coded bits in all code blocks of this transport block, is transmitted as one MIMO codeword. Each MIMO codeword can be carried on one or multiple MIMO layers. The process of generating multiple code blocks is similar to that of the encoding process of the High Speed Data Shared Channel (HS-DSCH) in a High Speed Downlink Packet Access (HSDPA) system, which is illustrated in the FIG. 9. In the current HS-DSCH design, only one 24-bit cyclic redundancy check (CRC) is generated for the whole transport block for the purpose of error detection for that block. If multiple code blocks are generated and transmitted in one transmission time interval (TTI), the receiver may correctly decode some of the code blocks but not the others. In that case, the receiver will feedback a non-acknowledgement (NAK) to the transmitter because the CRC for the transport block will not check.

Figure 10:
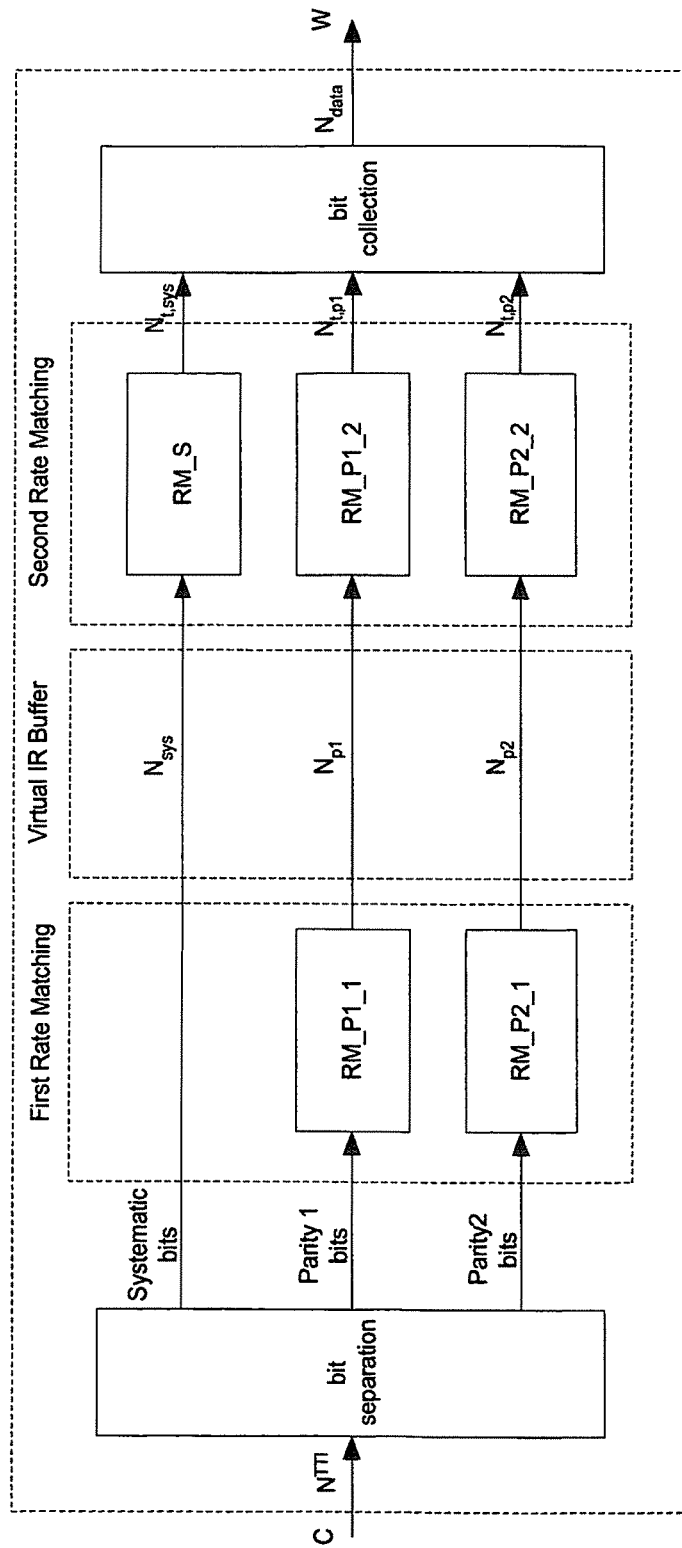
FIG. 10 schematically illustrates High Speed Data Shared Channel (HS-DSCH) hybrid ARQ functionality.

The hybrid ARQ functionality matches the number of bits at the output of the channel coder to the total number of bits of the High Speed Physical Downlink Shared Channel (HS-PDSCH) set to which the High Speed Data Shared Channel (HS-DSCH) is mapped. The hybrid ARQ functionality is controlled by the redundancy version (RV) parameters. The exact set of bits at the output of the hybrid ARQ functionality depends on the number of input bits, the number of output bits, and the RV parameters. The hybrid ARQ functionality consists of two rate-matching stages 231 and 232, and a virtual buffer 240 as shown in FIG. 10. First rate matching stage 231 matches the number of input bits to virtual IR buffer 240, information about which is provided by higher layers. Note that, if the number of input bits does not exceed the virtual IR buffering capability, first rate-matching stage 231 is transparent. Second rate matching stage 232 matches the number of bits at the output of first rate matching stage 231 to the number of physical channel bits available in the HS-PDSCH set in the TTI.

Figure 11:
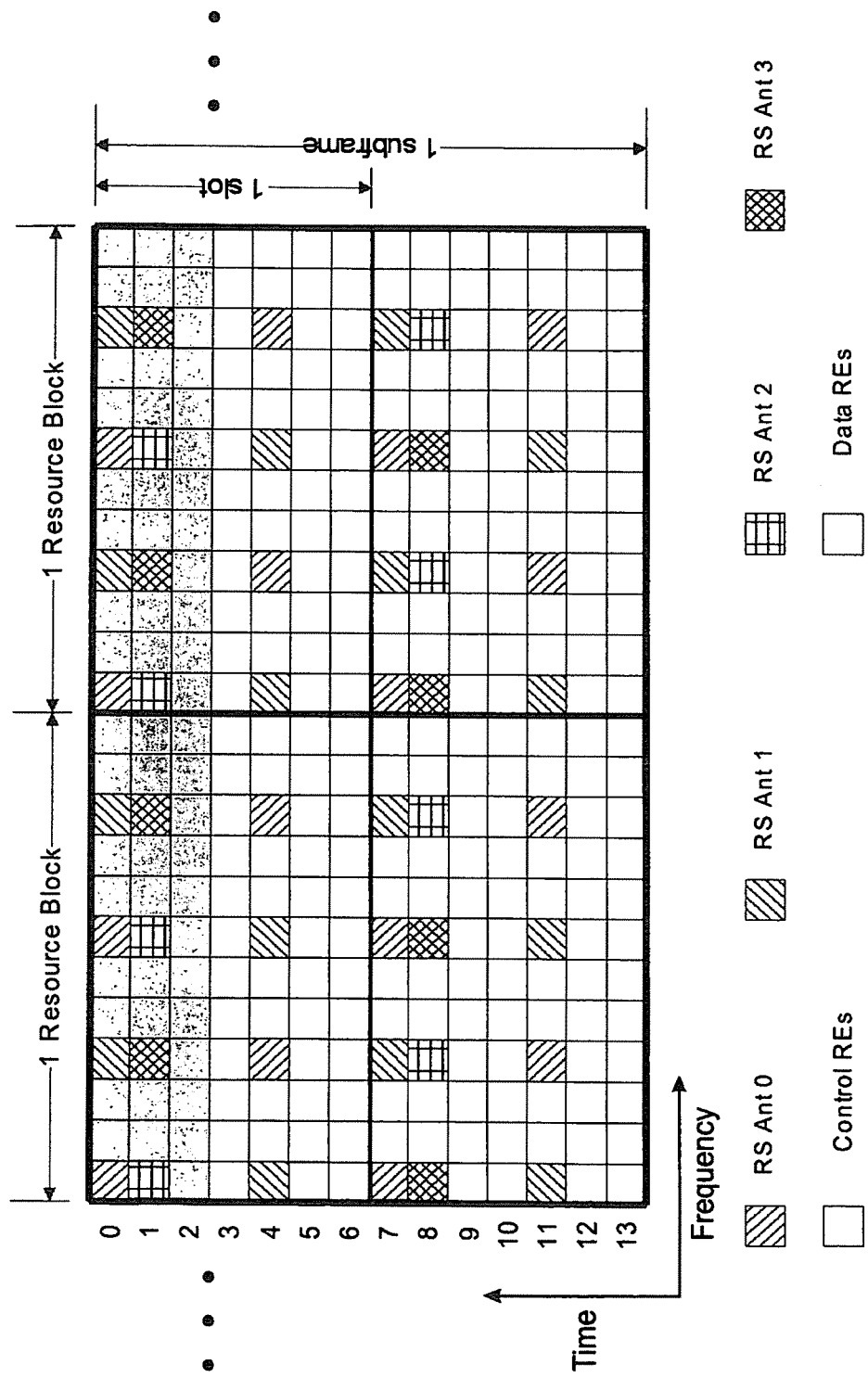
FIG. 11 schematically illustrates long term evolution (LTE) downlink subframe structure.

The downlink subframe structure of LTE is shown in FIG. 11. In a typical configuration, each subframe is 1 ms long, containing 14 OFDM symbols (i.e., time resource units). Assume the OFDM symbols in a subframe are indexed from 0 to 13. Reference symbols (RS) for antenna 0 and 1 are located in OFDM symbols 0, 4, 7, and 11. If present, reference symbols (RS) for antennas 2 and 3 are located in OFDM symbols 2 and 8. The control channels, including Control Channel Format Indicator (CCFI), acknowledgement channel (ACK), packet data control channel (PDCCH), are transmitted in the first one, or two, or three OFDM symbols. The number of OFDM symbols used for control channel is indicated by CCFI. For example, the control channels can occupy the first OFDM symbol, or the first two OFDM symbols, or the first three OFDM symbols. Data channels, i.e., Physical Downlink Shared Channel (PDSCH), are transmitted in other OFDM symbols.

Figure 12:
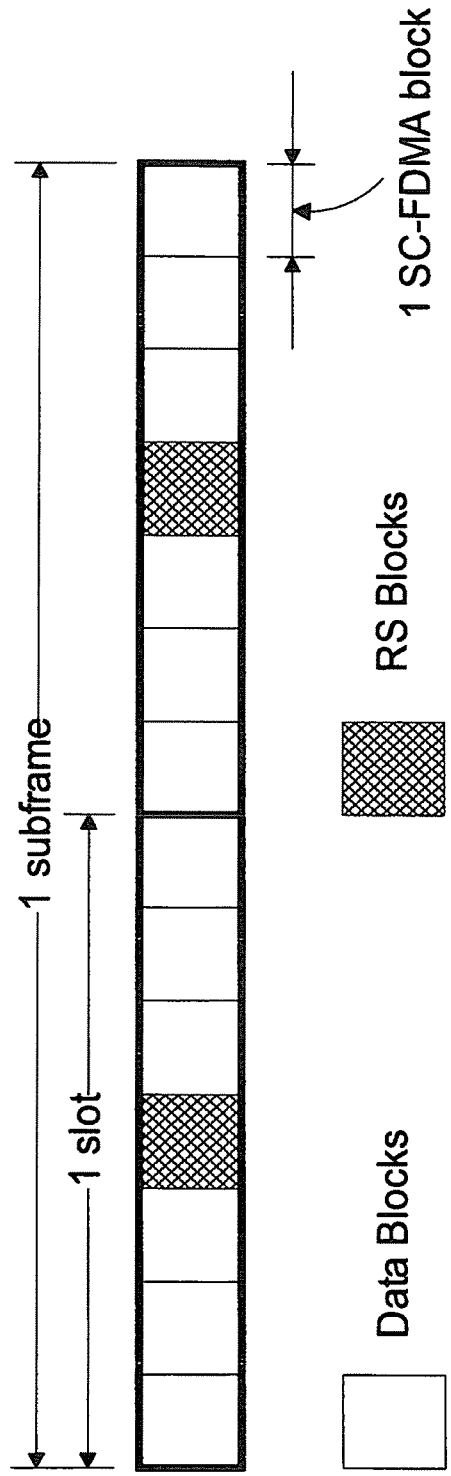
FIG. 12 schematically illustrates LTE uplink subframe structure.

The uplink subframe structure (for data transmissions) is shown in FIG. 12. Note the LTE uplink is a SC-FDMA based system, which is very much like an OFDMA system with some differences. Similar to an OFDM symbol, each SC-FDMA block has a cyclic prefix (CP). For data transmissions, the reference signals (RSs) are located at the 4-th SC-FDMA block and the 11-th SC-FDMA block, while the rest of the SC-FDMA blocks carrying data. Note that FIG. 13 only shows the time-domain structure of an uplink subframe. For each individual UE, its transmission may only occupy a portion of the whole bandwidth in frequency domain. And different users and control signals are multiplexed in the frequency domain via SC-FDMA.

In this invention, we propose methods and apparatus for channel interleaving in OFDM systems. Note that in the context of an OFDMA system or a single-carrier FDMA system, channel interleaving is often referred to as modulation symbol to resource mapping. In this invention, channel interleaving and modulation symbol to resource mapping are interchangeable.

Aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive. The invention is illustrated by way of example, and not by way of limitation, in the figures of the accompanying drawings. In the following illustrations, we mostly use the downlink OFDMA system in 3GPP LTE system as an example. The techniques illustrated here can, however, certainly be applied to the uplink SC-FDMA system, and in other systems whenever applicable.

In a first embodiment according to the principles of the present invention, an indexing scheme is proposed to enable easy addressing of the resource elements (REs) within a resource assignment. Multiple resource blocks (RBs) may be assigned to a data transmission. This resource assignment assigns multiple sub-carriers in multiple OFDM symbols for the data transmission. Assume there are $N_i$ REs available for data transmission in OFDM symbol i. Use the LTE downlink as an example, the total number of REs available for data transmission in a subframe is $$N = \sum_{i=1}^{14} N_i. \quad (1)$$

Figure 13:
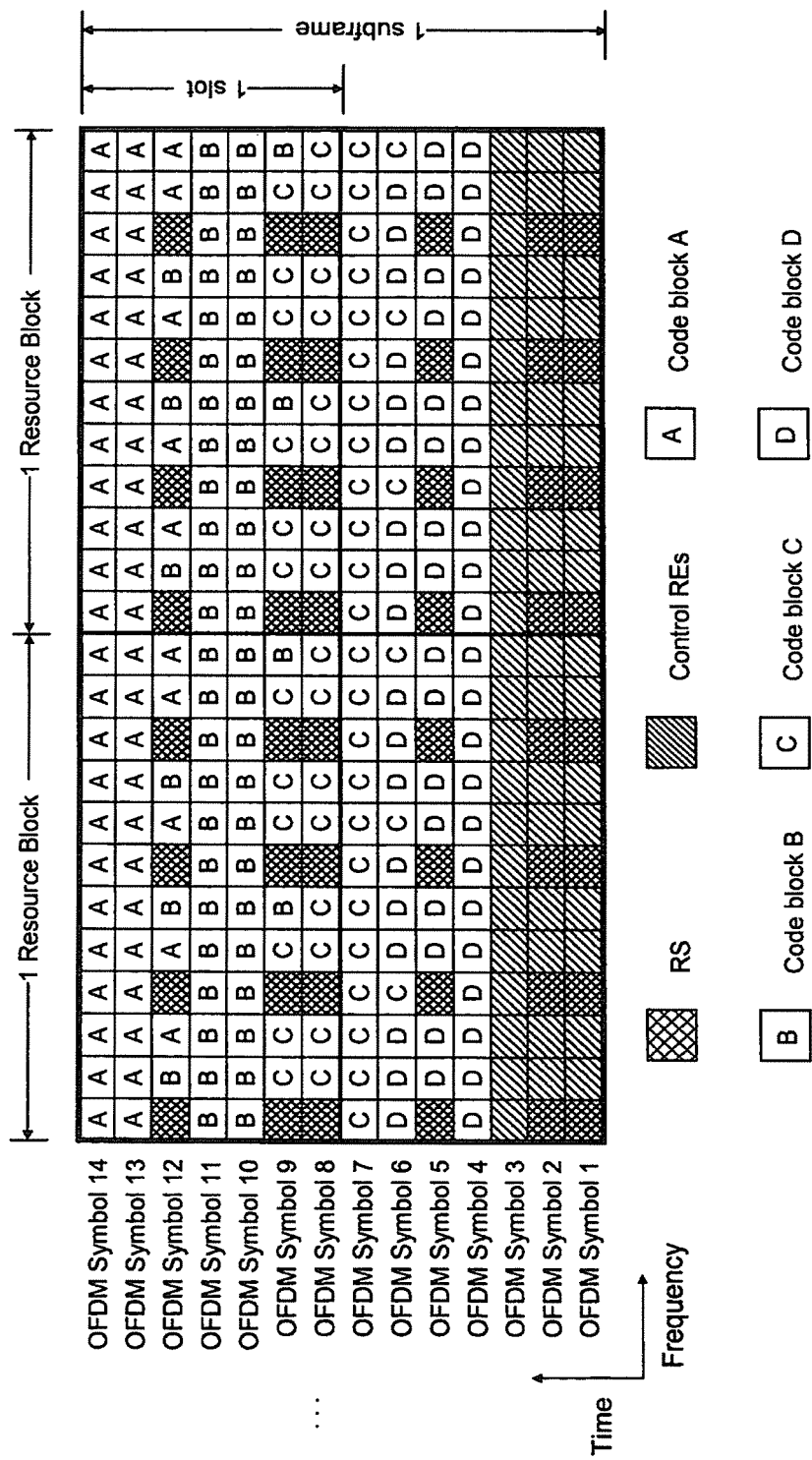
FIG. 13 schematically illustrates a channel interleaving scheme according to one embodiment of the principles of the present invention.

Note that not all OFDM symbols in a transmission interval are data-carrying. For example, as shown in FIG. 13, if the transmission interval is defined as a subframe, and the control channel occupies the first three OFDM symbols, only OFDM symbol 4-14 are data carrying OFDM symbols. So, $N_i=0$ for i=1, 2, 3. We can index the data REs from 0 to N−1. One example of the indexing scheme is described as follows.

First, we determine the index-within-an-OFDM-symbol for data REs in OFDM symbol i, i=1, 2, . . . , 14. We define the natural order index by simply assigning smaller indices to REs located in lower frequency and higher indices for REs in higher frequency for a given OFDM symbol. So the data REs in the first OFDM symbol are assigned with natural order indices from 0 to $N_1-1$; the data REs in the $2^{nd}$ OFDM symbol are assigned with natural order indices from 0 to $N_2-1$; and so on. The index-within-an-OFDM-symbol assigned to a data RE can be made equal to the natural order index of that data RE. Nevertheless, note that a frequency domain interleaving in OFDM symbol i can be achieved by changing the index-within-an-OFDM-symbol for data REs in OFDM symbol i. For example, a frequency domain interleaves can be applied to naturally-indexed data REs in an OFDM symbol. Assume the interleaving function is $y=I_i(x)$ where x, y∈{0, 1, . . . , $N_i-1$} for OFDM symbol i. Frequency domain interleaving can be achieved by assigning an index-within-an-OFDM-symbol of $I_i(x)$ to a data RE with a natural-order index of x in OFDM symbol i. The interleaving function $I_i(x)$ can be selected to be any interleaving or mapping without departing from the scope of this invention. Note that, equivalently, frequency domain interleaving can also be achieved by applying the interleaving function $I_i(x)$ to modulation symbols and then mapping the interleaved modulation symbols to the naturally-ordered REs.

Next, in time domain, the indexing scheme goes through the OFDM symbols in natural order, or in other orders as dictated by other design concerns, in order to generate index-within-an-assignment. For illustration purpose, we assume the indexing scheme goes through the OFDM symbols in natural order. Therefore, the data REs in the first OFDM symbol are assigned with index-within-an-assignment from 0 to $N_1-1$; the data REs in the $2^{nd}$ OFDM symbol are assigned with index-within-an-assignment from $N_1$ to $N_1+N_2-1$; and so on. Assuming the indexing scheme goes through the OFDM symbols in natural order, the index-within-an-assignment, $I_A(x,i)$, of a data RE with index-within-an-OFDM-symbol of $I_i(x)$ in OFDM symbol i is given by $$I_A(x, i) = I_i(x) + \sum_{k=1}^{i-1} N_k, \text{ for } i = 1, 2, \ldots, 14, \text{ and} \quad (2)$$

$$x = 0, 1, \ldots, N_i - 1.$$

In a second embodiment according to the principles of the present invention, the total available resource elements are assigned to a plurality of code blocks according to a formula such that the amount of resources assigned to each code block is as equal as possible. For illustration purpose, we assume each modulation symbol, or each resource element (RE), only contain coded bits from one code block. The embodiments in this invention, however, clearly apply to cases where modulation symbols may contain coded bits from multiple code blocks. Assume there are $N_{seg}$ code blocks. Define ⌈x⌉ as the smallest integer that is larger than or equal to x. Define ⌊x⌋ as the largest integer that is smaller than or equal to x. As an example, the number of data REs assigned to code block j, $M_j$, could be given by $$M_j = \left\lceil \frac{N-j}{N_{seg}} \right\rceil, \text{ for } j = 0, 1, \ldots, N_{seg} - 1. \quad (3)$$

The channel interleaving algorithms need to take into account the scenario of multiple code blocks within one transport block, which can happen when the transport block size is larger than the largest allowable code block size. One example is shown in FIG. 13. For illustration purpose, we assume each modulation symbol, or each resource element (RE), only contain coded bits from one code block. The embodiments in this invention, however, clearly apply to cases where modulation symbols may contain coded bits from multiple code blocks. In the example shown in FIG. 13, there are four code blocks. The modulation symbols that carry coded bits of code block A are mapped to REs in OFDM symbols 4, 5, and 6; the modulation symbols that carry coded bits of code block B are mapped to REs in OFDM symbols 6, 7, 8, and 9; the modulation symbols that carry coded bits of code block C are mapped to REs in OFDM symbols 9, 10, 11, and 12; the modulation symbols that carry coded bits of code block D are mapped to REs in OFDM symbols 12, 13, and 14. For the sake of convenience, we call this type of channel interleaving that attempts to multiplex code blocks in a sequential manner the time-domain-multiplexing-first (TDM-first) approach. Clearly, as shown in FIG. 13, there are still frequency-domain-multiplexing of code blocks in, e.g., OFDM symbols 6, 9, and 12. When the data rate is high or the number of code blocks is large, it is beneficial to try to TDM these multiple code blocks because it allows the receiver to start processing some of the code blocks before receiving the whole subframe and thus reducing the complexity and cost of the receiver.

Define $I_C(x,i)$ as the index of the code block that the RE with the index-within-an-assignment of $I_A(x,i)$ is assigned to. In a third embodiment according to the principles of the present invention, according to the aforementioned resource element indexing scheme, we can assign the REs having the index-within-an-assignment, $I_A(x,i)$, to code block j, such that:

$$I_C(x, i) = j, \quad (4)$$

$$\text{if } \sum_{k=0}^{j-1} \left\lceil \frac{N-j}{N_{seg}} \right\rceil \le I_A(x, i) < \sum_{k=0}^{j} \left\lceil \frac{N-j}{N_{seg}} \right\rceil.$$

Equivalently, we can assign the REs having the index-within-an-assignment, $I_A(x,i)$, to code block j, such that:

$$j \times \left\lceil \frac{N}{N_{seg}} \right\rceil \le I_A(x, i) < (j+1) \times \left\lceil \frac{N}{N_{seg}} \right\rceil, \quad (5)$$

$$\text{if } 0 \le j < (N \bmod N_{seg}).$$

We also assign the REs having the index-within-an-assignment, $I_A(x,i)$, to code block j, such that:

$$N - (N_{seg} - j) \times \left\lfloor \frac{N}{N_{seg}} \right\rfloor \le I_A(x, i) < N - (N_{seg} - j - 1) \times \left\lceil \frac{N}{N_{seg}} \right\rceil, \quad (6)$$

if $(N \bmod N_{seg}) \le j < N_{seg}$.

In doing so, we can also achieve the channel interleaving effect as shown in FIG. 13.

Additional considerations may lead to further refinement of the previous embodiments. For example, in order to accommodate transmit diversity schemes such as space frequency block code (SFBC), we may map the modulation symbols to two data REs that are located in the same OFDM symbol and adjacent to each other. Note it is possible that there are REs occupied or reserved by overhead channels, e.g., reference symbols, between these two adjacent data REs. In order to achieve this, for example, the indexing scheme can make sure that the indices-within-an-OFDM-symbol, $I_i(x)$, of two adjacent data REs are consecutive. Without loss of generality, we assume N is an even number. Then, according to a fourth embodiment of the principles of the present invention, the number of data REs assigned to code block j, $M_j$, could be given by $$M_j = \left\lceil \frac{N/2 - j}{N_{seg}} \right\rceil \times 2, \quad (7)$$

for $j = 0, 1, \ldots, N_{seg} - 1$.

Accordingly, we assign the REs having the index-within-an-assignment, $I_A(x,i)$, to code block j, such that:

$$I_C(x, i) = j, \quad (8)$$

if $\sum_{k=0}^{j-1} \left\lceil \frac{N/2 - j}{N_{seg}} \right\rceil \times 2 \le I_A(x, i) < \sum_{k=0}^{j} \left\lceil \frac{N/2 - j}{N_{seg}} \right\rceil \times 2.$ Equivalently, we can assign the REs having the index within an assignment, $I_A(x,i)$, to code block j, such that:

$$2 \times j \times \left\lceil \frac{N}{2 \times N_{seg}} \right\rceil \le I_A(x, i) < 2 \times (j + 1) \times \left\lceil \frac{N}{2 \times N_{seg}} \right\rceil, \quad (9)$$

if $0 \le j < (N \bmod N_{seg})$;

we also assign the REs having the index-within-an-assignment, $I_A(x,i)$ to code block j, such that:

$$N - 2 \times (N_{seg} - j) \times \left\lfloor \frac{N}{2 \times N_{seg}} \right\rfloor \le \\ I_A(x, i) < N - 2 \times (N_{seg} - j - 1) \times \left\lceil \frac{N}{2 \times N_{seg}} \right\rceil, \quad (10)$$

if $(N \bmod N_{seg}) \le j < N_{seg}$.

Figure 14:
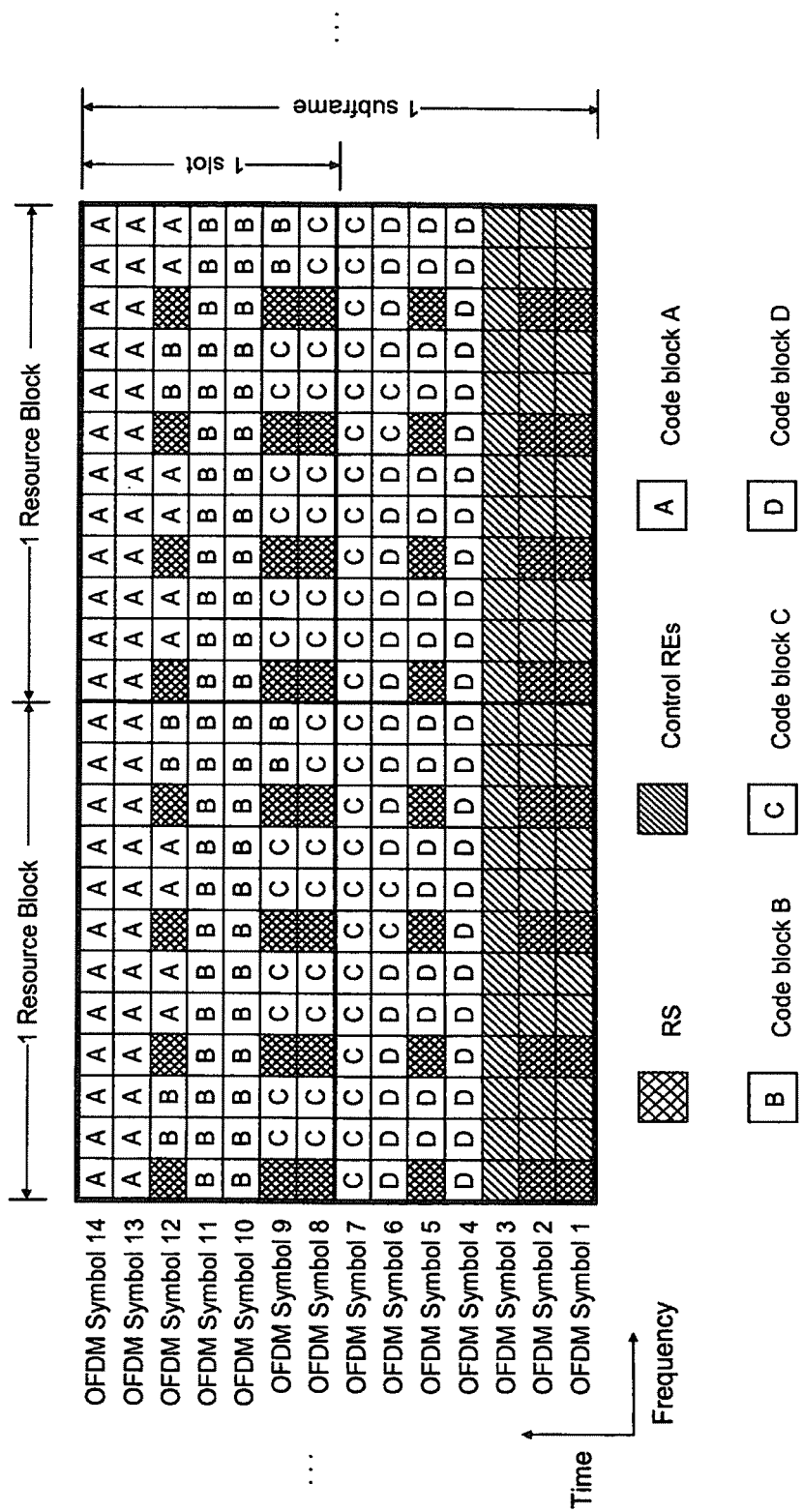
FIG. 14 schematically illustrates a channel interleaving scheme according to another embodiment of the principles of the present invention.

In doing so, we can also achieve the channel interleaving effect as shown in FIG. 14. If N is odd, one data RE needs to be discarded because SFBC requires two data REs for each SFBC operation. In other words, we may decrease N by one so that the algorithms illustrated above become applicable.

Figure 15:
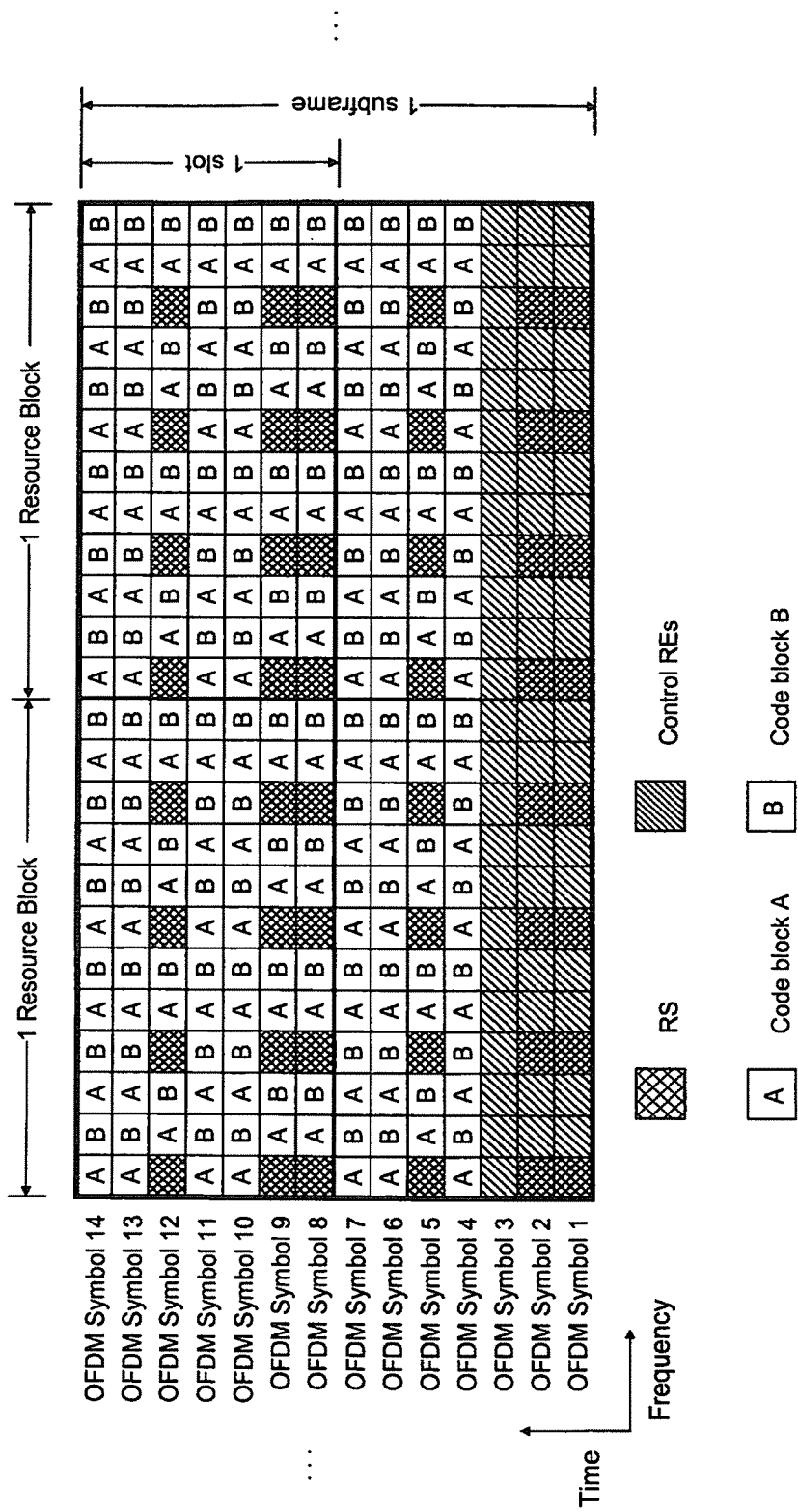
FIG. 15 schematically illustrates a channel interleaving scheme according to still another embodiment of the principles of the present invention.

On the other hand, when the data rate is low or the number of code blocks is small, the benefit of the TDM-first approach is less important for a given UE capability because the UE is built to be able to receive a larger number of code blocks. In that case, we will prefer to maximize the performance of the transmission by allowing each code blocks to take advantage of as much time diversity as possible. For the sake of convenience, we call this type of channel interleaving that attempts to multiplex multiple code blocks in frequency a frequency-domain-multiplexing-first (FDM-first) approach. One example of this approach is shown in FIG. 15 according to a fifth embodiment of the principles of the present invention. In this example, there are two code blocks. In order to maximize time diversity, modulation symbols for each code block are present in each OFDM symbol. At the same time, in order to maximize frequency diversity, modulation symbols for each code block are interlaced in each OFDM symbols. In this way, each code block captures most of the frequency and time diversity within the resource assigned to this transmission, thus providing equal protection to each code blocks and therefore maximizing the overall performance of the transmission.

In a sixth embodiment according to the principles of the present invention, we can assign, to code block j, the REs having the index-within-an-assignment of $$I_A(x, i) = m \times N_{seg} + j, \quad (11)$$

for $m = 0, 1, \ldots, \left\lceil \frac{N - j}{N_{seg}} \right\rceil - 1$.

Equivalently, we can assign the RE having the index-within-an-assignment of $I_A(x,i)$, to code block j such that $$j = I_A(x,i) \bmod N_{seg}, \text{ for } I_A(x,i) = 0, 1, \ldots, N-1. \quad (12)$$

In doing so, we can achieve the channel interleaving effect as shown in FIG. 15.

Additional considerations may lead to further refinement of the previous embodiments. For example, in order to accommodate transmit diversity schemes such as space frequency block code (SFBC), we may map the modulation symbols to two data REs that are located in the same OFDM symbol and adjacent to each other. Again, it is possible that there are REs occupied or reserved by overhead channels, e.g., reference symbols, between these two adjacent data REs. In order to achieve this, for example, the indexing scheme can make sure that the index-within-an-OFDM-symbol, $I_i(x)$, of two adjacent data REs are consecutive. Without loss of generality, we assume N is an even number. According to a seventh embodiment of the principles of the present invention, the number of data REs assigned to code block j, $M_j$, could be given by:

$$M_j = \left\lceil \frac{N/2 - j}{N_{seg}} \right\rceil \times 2, \quad (13)$$

for $j = 0, 1, \ldots, N_{seg} - 1$.

Accordingly, we assign the REs having the index-within-an-assignment, $I_A(x,i)$, to code block j, such that $$\left\lfloor \frac{I_A(x, i)}{2} \right\rfloor = m \times N_{seg} + j, \quad (14)$$

$$\text{for } m = 0, 1, \ldots, \left\lceil \frac{N/2 - j}{N_{seg}} \right\rceil - 1.$$

Equivalently, we can assign the RE having the index-within-an-assignment of $I_A(x,i)$, to code block j such that $$j = \left\lfloor \frac{I_A(x, i)}{2} \right\rfloor \mod N_{seg}, \quad (15)$$

$$\text{for } I_A(x, i) = 0, 1, \ldots, N - 1.$$

Figure 16:
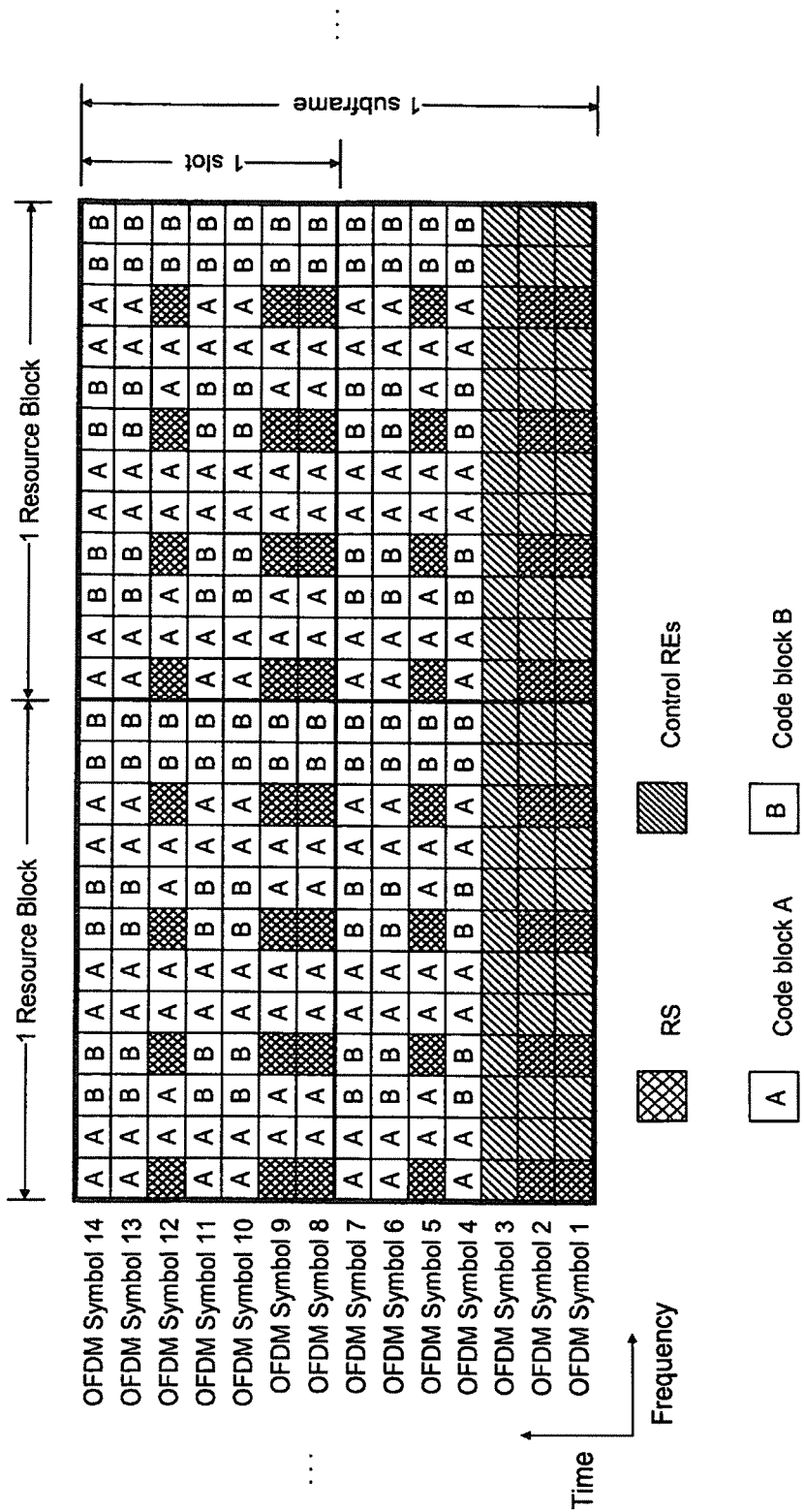
FIG. 16 schematically illustrates a channel interleaving scheme according to a further embodiment of the principles of the present invention.

In doing so, we can achieve the channel interleaving effect as shown in FIG. 16. If N is odd, one data RE needs to be discarded because SFBC requires two data REs for each SFBC operation. In other words, we may decrease N by one so that the algorithms illustrated above become applicable.

Comparing TDM-first and FDM-first type of channel interleaving schemes, we observe that it is advantageous to apply TDM-first type of channel interleaving methods for high data rate transmissions and apply FDM-first type of channel interleaving methods for low data rate transmissions. The switching point can be defined as a function of the number of code blocks, or a function of the transport block size, or a function of the data rate. The switching point can be a constant for a cell or a system.

In an eighth embodiment according to the principles of the present invention, if the number of code blocks to be transmitted in a transmission interval is large, the data of at least one of a plurality of code blocks are only transmitted in a number of consecutive data-carrying OFDM symbols, such that the number of the consecutive data-carrying OFDM symbols is less than the total number of data-carrying OFDM symbols in the transmission interval; if the number of code blocks is small, the data of at least one of a plurality of code blocks are transmitted in all data-carrying OFDM symbols in the transmission interval. One way to implement this embodiment is to define a threshold for the number of code blocks, $N_{thresh}$. If the number of code blocks, $N_{seg}$, is larger than $N_{thresh}$, then TDM-first channel interleaving is used; otherwise, FDM-first channel interleaving is used. Note the transmission interval can be defined as, but not limited to, a subframe, or a slot, or multiple consecutive OFDM symbols within a subframe. Also note that there may be non-data-carrying OFDM symbols among the consecutive data-carrying OFDM symbols. For example, if OFDM symbols 2 and 4 carry data but all REs in OFDM symbol 3 are occupied by control or reserved for other purposes, OFDM symbols 2 and 4 are still defined to be consecutive data-carrying OFDM symbols. For example, if the number of code blocks is large, e.g., $N_{seg}=4$, we can assign the REs to code blocks according to Equation (4) or Equation (8) or their equivalencies. In doing so, we can achieve the channel interleaving effect as shown in FIG. 13 or FIG. 14. If the number of code blocks is small, e.g., $N_{seg}=2$, we can assign the REs to code blocks according to Equation (11) or Equation (14) or their equivalencies. In doing so, we can achieve the channel interleaving effect as shown in FIG. 15 or FIG. 16.

In a ninth embodiment according to the principles of the present invention, if the size of the transport block to be transmitted in a transmission interval is large, the data of at least one of a plurality of code blocks are only transmitted in a number of consecutive data-carrying OFDM symbols such that the number of consecutive data-carrying OFDM symbols is less than the total number of data-carrying OFDM symbols in the transmission interval; if the size of the transport block is small, the data of at least one of a plurality of code blocks are transmitted in all data-carrying OFDM symbols in the said transmission interval. Note the transmission interval can be defined as, but not limited to, a subframe, or a slot, or multiple consecutive OFDM symbols within a subframe. Also note that there may be non-data-carrying OFDM symbols between the consecutive data-carrying OFDM symbols. For example, if OFDM symbols 2 and 4 carry data but all REs in OFDM symbol 3 are occupied by control or reserved for other purposes, OFDM symbols 2 and 4 are still defined to be consecutive data-carrying OFDM symbols. One way to implement this embodiment is to define a threshold for the transport block size, $L_{thresh}$. If the transport block size, $L_{TB}$, is larger than $L_{thresh}$, then TDM-first channel interleaving is used; otherwise, FDM-first channel interleaving is used.

In a tenth embodiment according to the principles of the present invention, the threshold of the number of code blocks or the threshold of the transport block size, upon which the switching of TDM-first and FDM-first channel interleaving algorithms depends, can be configured on a per User Equipment (UE) basis. As pointed out earlier, the thresholds can be a system-wide or cell-wide constant or configuration. Multiple user equipment in a system, however, may have difference UE capability configuration. In that case, it is advantageous to set the switching thresholds according to each UE's situation such as, but not limited to, UE capabilities.

In an eleventh embodiment according to the principles of the present invention, the code block segmentation for at least two of a plurality of the MIMO codewords are synchronized such that the two MIMO codewords have the same number of code blocks. In a multi-codeword MIMO transmission (MCW MIMO), each codeword may carry multiple code blocks. Having the same number of code blocks can benefits the receiver design and allow more effective interference cancellation. Preferably, the number of code blocks is determined based on the codeword with a larger number of information bits.

In a twelfth embodiment according to the principles of the present invention, the channel interleaving for at least two of a plurality of MIMO codewords are synchronized such that the resources assigned to at least a first code block in the first MIMO codeword includes all of the resources assigned to a second code block in the second MIMO codeword. This embodiment enables the receiver to cancel the interference from the first code block in the first MIMO codeword to the second code block in the second MIMO codeword before the decoding of all code blocks in the first MIMO codeword is completed.

In a thirteenth embodiment according to the principles of the present invention, the channel interleaving for at least two of a plurality of MIMO codewords are synchronized such that the resources assigned to at least a first code block in the first MIMO codeword are the same as the resources assigned to a second code block in the second MIMO codeword. Similar to the previous embodiment, this embodiment enables the receiver to cancel the interference from the first code block in the first MIMO codeword to the second code block in the second MIMO codeword before the decoding of all code blocks in the first MIMO codeword is completed.

In a fourteenth embodiment according to the principles of the present invention, an indexing scheme is proposed to enable ease addressing of the resource elements within a resource assignment in an SC-FDMA system. In this case, the resource elements can be defined at the input to the DFT at the transmitter or the output of the IDFT at the receiver in FIG. 4. Assume there are $N_i$ REs available for data transmission in SC-FDMA block i. The total number of REs available for data transmission in a slot is:

$$N = \sum_{i=1}^{7} N_i. \quad (16)$$

Note that not all SC-FDMA blocks in a transmission interval are data-carrying. For example, if the transmission interval is defined as a slot, and the control channel occupies the 4-th SC-FDMA block, only SC-FDMA block 1, 2, 3, 5, 6, 7 are data carrying SC-FDMA blocks. So, $N_i=0$ for i=4. In a SC-FDMA transmission, typically the numbers of data REs within SC-FDMA blocks are equal, if there is no multiplexing between control and data within an SC-FDMA block. Some of the REs within an SC-FDMA block may be used, however, by other uplink overhead channel such as uplink acknowledgement (UL ACK) or uplink channel quality indication (UL CQI) feedback. In that case, the number of data REs per SC-FDMA block, $N_i$, may not be equal for all data-carrying SC-FDMA blocks. We can then index the data REs from 0 to N−1. One example of the indexing scheme is described as follows.

First we determine the index within an SC-FDMA block for data REs in SC-FDMA block i, i=1, 2, . . . , 7. We obtain the natural order index by simply assigning smaller indices to REs with lower indices of the DFT input for a given SC-FDMA block. Therefore, the data REs in the first SC-FDMA block are assigned with the natural order indices from 0 to $N_1-1$; the data REs in the second OFDM symbol are assigned with the natural order indices from 0 to $N_2-1$; and so on. The index within an SC-FDMA block of a data RE can be made equal to the natural order index of that data RE. Nevertheless, note that time domain interleaving in SC-FDMA block i can be achieved by changing the indices within an SC-FDMA block for data REs in SC-FDMA block i. For example, a time domain interleaver can be applied to naturally-indexed data REs in an SC-FDMA block. Assume the interleaving function is $y=I_i(x)$ where x, $y \in \{0, 1, \ldots, N_i-1\}$ for SC-FDMA block i. Time domain interleaving can be achieved by assigning an index within an SC-FDMA block, $I_i(x)$, to a data RE with a natural-order index of x in SC-FDMA block i. The interleaving function $I_i(x)$ can be selected to be any interleaving or mapping without departing from the scope of this invention.

Next, within a transmission interval, the indexing scheme goes through the SC-FDMA blocks in a natural order, or in other orders as dictated by other design concerns, in order to generate an index-within-an-assignment. For illustration purpose, we assume the indexing scheme going through the SC-FDMA blocks in the natural order. Therefore, the data REs in the first SC-FDMA block are assigned with indices-within-an-assignment from 0 to $N_1-1$; the data REs in the second SC-FDMA block are assigned with indices-within-an-assignment from $N_1$ to $N_1+N_2-1$; and so on. Assuming the indexing scheme going through the SC-FDMA blocks in natural order, the index-within-an-assignment, $I_A(x,i)$, of a data RE with an index within an SC-FDMA block, $I_i(x)$, in SC-FDMA block i is given by:

$$I_A(x, i) = I_i(x) + \sum_{k=1}^{i-1} N_k, \text{ for } i = 1, 2, \ldots, 14, \text{ and} \quad (17)$$

$$x = 0, 1, \ldots, N_i - 1.$$

In a fifteenth embodiment according to the principles of the present invention, the total available resource elements are assigned to a plurality of code blocks according to a formula such that the amount of resources assigned to each code block is as equal as possible. For illustration purpose, we assume each modulation symbol, or each resource element (RE), only contain coded bits from one code block. The embodiments in this invention, however, clearly apply to cases where modulation symbols may contain coded bits from multiple code blocks. Assume there are $N_{seg}$ code blocks. Define $\lceil x \rceil$ as the smallest integer that is larger than or equal to x. Define $\lfloor x \rfloor$ as the largest integer that is smaller than or equal to x. As an example, the number of data REs assigned to code block j, $M_j$, could be given by $$M_j = \left\lceil \frac{N-j}{N_{seg}} \right\rceil, \quad (18)$$

for $j = 0, 1, \ldots, N_{seg} - 1$.

Clearly, the mapping schemes or the algorithm to determine which data RE is assigned to which code block as illustrated for OFDMA systems are also applicable in SC-FDMA systems. For example, Equation (4) can be used for TDM-first mapping schemes and Equation (11) can be used for FDM-first mapping schemes. Also note that in this example, we use a slot as a transmission interval. In the case that a data transmission spans over one subframe, i.e., two slots, the mapping scheme in this embodiment can be applied to both slots. Alternatively, a subframe can be used as a transmission interval and the mapping scheme in this embodiment can be applied to the whole subframe without departing from the scope of the invention.

In a sixteenth embodiment according to the principles of the present invention, if the number of code blocks is large, the data of at least one of a plurality of code blocks are only transmitted in a number of consecutive data-carrying SC-FDMA blocks with the said number of consecutive data-carrying SC-FDMA blocks less than the total number of data-carrying SC-FDMA blocks in the said transmission interval; if the number of code blocks is small, the data of at least one of a plurality of code blocks are transmitted in all data-carrying SC-FDMA blocks in the said transmission interval. Note the transmission interval can be defined as, but not limited to, a subframe, or a slot, or multiple consecutive SC-FDMA blocks within a subframe. Also note that there may be non-data-carrying SC-FDMA blocks between the consecutive data-carrying SC-FDMA blocks. For example, if SC-FDMA block 2 and 4 carry data but SC-FDMA block 3 is occupied by control or reserved for other purposes, SC-FDMA block 2 and 4 are still defined to be consecutive data-carrying SC-FDMA blocks.

In a seventeenth embodiment according to the principles of the present invention, if the size of the transport block is large, the data of at least one of a plurality of code blocks are only transmitted in a number of consecutive data-carrying SC-FDMA blocks with the said number of consecutive data-carrying SC-FDMA blocks less than the total number of data-carrying SC-FDMA blocks in the said transmission interval; if the size of the transport block is small, the data of at least one of a plurality of code blocks are transmitted in all data-carrying SC-FDMA blocks in the said transmission interval. Note the transmission interval can be defined as, but not limited to, a subframe, or a slot, or multiple consecutive SC-FDMA blocks within a subframe. Also note that there may be non-data-carrying SC-FDMA blocks between the consecutive data-carrying SC-FDMA blocks. For example, if SC-FDMA block 2 and 4 carry data but SC-FDMA block 3 is occupied by control or reserved for other purposes, SC-FDMA block 2 and 4 are still defined to be consecutive data-carrying SC-FDMA blocks.

As is explained in the descriptions, in the practice of the principles of the present invention, data is organized by transported blocks first. Essentially, one transport block (i.e., TB) is a packet. When a TB is really big (more than 6144 bits), the TB is segmented into multiple code blocks (CB). Each CB will be encoded using turbo code. Coded bits are selected by the rate matching algorithm for each transmission. One TB, including all the selected coded bits for all code blocks of this TB, is transmitted as one MIMO codeword. Each MIMO codeword can be carried on one or multiple MIMO layers.

Basically, a data transport block is first segmented into multiple code blocks, and then encoded on a code block basis. But all the selected coded bits for all code blocks of one transport block are transmitted in one MIMO codeword.

The advantage of segmenting a large transport block into smaller code blocks is the reduced complexity and buffer size at the receiver/decoder.

Channel coding should not be confused with MIMO processing. There is no significance in the term "codeword block", because there are "code blocks" and "MIMO codewords." Transport blocks (i.e., TB) and code blocks (i.e., CB) constitute the encoding aspect of code blocks that constitute a part of the channel coding processing. MIMO codewords however, are a part of the MIMO processing.

A transport block is first segmented into a plurality of code blocks. Each code block is encoded by a forward-error correction (i.e., FEC) code. These two steps are part of the channel coding processing. Then, the output, namely the encoded bits, are processed by the MIMO processing, which creates multiple MIMO codewords. Typically, one transport block corresponds to one MIMO codeword, and that MIMO codeword may be carried by one, or by multiple, MIMO layers.

What is claimed is:

1. A method for data transmission, the method comprising:
    segmenting a transport block into multiple code blocks;
    encoding the multiple code blocks separately by using a turbo code;
    selecting coded bits for each of the encoded multiple code blocks, where a number of the coded bits for each of the encoded multiple code blocks is obtained based on a total number of available bits and a number of code blocks; and
    transmitting the selected coded bits on one layer or multiple layers.

2. The method of claim 1, wherein the number of the coded bits for each of the encoded multiple code blocks is obtained further based on a transmit diversity.

3. The method of claim 1, wherein the number of the coded bits for each of the encoded multiple code blocks is determined by a modulation symbol unit.

4. The method of claim 1, wherein the coded bits for each of the encoded multiple code blocks are mapped in a sub-frame by ascending order of time index.

5. An apparatus for data transmission in a communication system, the apparatus comprising:
    a memory;
    at least one processing circuit operably connected to the memory, the at least one processor configured to:
        segment a transport block into multiple code blocks,
        encode the multiple code blocks separately,
        select coded bits for each of the encoded multiple code blocks, where a number of the coded bits for each of the encoded multiple code blocks is obtained based on a total number of available bits and a number of code blocks; and
    a transmitter configured to transmit the selected coded bits on one layer or multiple layers.

6. The apparatus of claim 5, wherein the number of the coded bits for each of the encoded multiple code blocks is obtained further based on a transmit diversity.

7. The apparatus of claim 5, wherein the number of the coded bits for each of the encoded multiple code blocks is determined by a modulation symbol unit.

8. The apparatus of claim 5, wherein the coded bits for each of the encoded multiple code blocks are mapped in a sub-frame by ascending order of time index.

* * * * *

UNITED STATES PATENT AND TRADEMARK OFFICE
CERTIFICATE OF CORRECTION

PATENT NO. : 9,444,591 B2
APPLICATION NO. : 14/600918
DATED : September 13, 2016
INVENTOR(S) : Zhouyue Pi, Jiannan Tsai and Farooq Khan It is certified that error appears in the above-identified patent and that said Letters Patent is hereby corrected as shown below:

In the claims

In claim 1 at col. 22, line 8, insert --selected-- prior to "coded bits".

In claim 2 at col. 22, line 16, insert --selected-- prior to "coded bits".

In claim 3 at col. 22, line 19, insert --selected-- prior to "coded bits".

In claim 4 at col. 22, line 21, insert --selected-- prior to "coded bits".

In claim 5 at col. 22, line 33, insert --selected-- prior to "coded bits".

In claim 6 at col. 22, line 41, insert --selected-- prior to "coded bits".

In claim 7 at col. 22, line 43, insert --selected-- prior to "coded bits".

In claim 8 at col. 22, line 45, insert --selected-- prior to "coded bits".

Signed and Sealed this
Twenty-fifth Day of October, 2016

Michelle K. Lee
*Director of the United States Patent and Trademark Office*